United States Patent [19]

Furuichi

[11] Patent Number: 5,437,037
[45] Date of Patent: Jul. 25, 1995

[54] SIMULATION USING COMPILED FUNCTION DESCRIPTION LANGUAGE

[75] Inventor: Tetsuo Furuichi, Sanda, Japan

[73] Assignee: Mega Chips Corporation, Tokyo, Japan

[21] Appl. No.: 73,810

[22] Filed: Jun. 7, 1993

[30] Foreign Application Priority Data

Jun. 5, 1992 [JP] Japan .................................. 4-171812

[51] Int. Cl.6 .............................................. G06F 9/455
[52] U.S. Cl. ...................................... 395/700; 364/490; 364/578; 364/DIG. 1; 364/232.3; 364/232.8
[58] Field of Search .......... 364/578, DIG. 1 MS File, 364/488, 490; 395/650, 700, 500

[56] References Cited

U.S. PATENT DOCUMENTS

| | | | |
|---|---|---|---|
| 4,972,334 | 11/1990 | Yamabe et al. | 364/DIG. 1 |
| 5,068,812 | 11/1991 | Schaefer et al. | 395/500 X |
| 5,084,824 | 1/1992 | Lam et al. | 364/488 X |

Primary Examiner—Thomas M. Heckler
Attorney, Agent, or Firm—Frishauf, Holtz, Goodman & Woodward

[57] ABSTRACT

A simulation program conversion method and system is provided. The original simulation program is written by a function description language, such as Verilog-HDL, using a text editor, and, then, the original simulation program is converted into an executable program using a programming language, such as the C language, so that the simulation program may be compiled before execution. The speed of execution of the simulation program is significantly improved.

10 Claims, 23 Drawing Sheets

Fig. 2
Prior Art

```
/*
    ADDER MODEL SAMPLE
*/
module ADDER (OUT,A,B);

output   [7:0]   OUT;
    input    [7:0]   A,B;
    reg      [7:0]   OUT;

//  Behavior modeling
    always @(A or B) begin : ADDER_LABEL
        reg [7:0]    tmp;

tmp = A+B;
        #10 OUT = tmp;
    end
endmodule
```

Fig. 8

```
module ADD_test1;
   reg [7:0] IN0, IN1;

wire [7:0] SUM;

ADDER U1 (SUM, IN0, IN1);

initial begin
      $monitor($time, "%d + %d -> %d", IN0, IN1, SUM);
   end initial begin
           IN0 = 1;IN1 = 2;
      #500 IN0 = 10;      IN1 = 20;
      #100 IN0 = 32;      IN1 = 40;
      #600 IN0 = 0;       IN1 = 5;
      #800 IN0 = 10;
      #100                IN1 = 20;
      #600 IN0 = 15;
      #5                  IN1 = 100;
      #5   IN0 = 2;
      #500
           $stop(2);
           $finish(2);
   end endmodule module ADDER (OUT, A, B) ;

output [7:0]      OUT;
   input  [7:0]      A, B;
   reg    [7:0]      OUT;

//   Behavior modeling always @(A or B) begin; ADDER_LABEL
      reg [7:0]       tmp;

tmp   = A + B;
      #10   OUT = tmp;
   end
endmodule
```

Fig. 9

```
<compile_result> : =
  (
  (MODU ADD_test null
    (
    (REG (RANG 7 nil nil 0) nil nil (IN0 IN1))
    (WIRE (RANG 7 nil nil 0) nil nil (SUM))

(INST ADDER null
        ((ICNN U1 ADDER null (SUM IN0 IN1))) )

(INIT nil nil nil
        (SEQB null null nil
          (
          ($MONITOR nil nil (STIM nil nil nil) "%d + %d ->%d" IN0 IN1 SUM))))

(INIT nil nil nil
        (SEQB null null nil
          (
          (= IN0 null nil 1)
          (= IN1 null nil 2)
          (# nil (= IN0 null nil 10) nil 500)
          (= IN1 null nil 20)
          (# nil (= IN0 null nil 32) nil 100)
          (= IN1 null nil 40)
          (# nil (= IN0 null nil 0) nil 600)
          (= IN1 null nil 5)
          (# nil (= IN0 null nil 10) nil 800)
          (# nil (= IN1 null nil 20) nil 100)
          (# nil (= IN0 null nil 15) nil 600)
          (# nil (= IN1 null nil 100) nil 5)
          (# nil (= IN0 null nil 2) nil 5)
          (# nil ($STP nil nil nil 2) nil 500)
          (SFSH nil nil nil 2)))))
    <ModuleInfo *ADD_test> )

(MODU ADDER (OUT A B)
    (
    (OTPT (RANG 7 nil nil 0) nil nil (OUT))
    (INPT (RANG 7 nil nil 0) nil nil (A B))
    (REG (RANG 7 nil nil 0) nil nil (OUT))
    (ALWY nil nil nil
        (8 nil
          (SEQB ADDER_LABEL
            ((REG (RANG 7 nil nil 0) nil nil (tmp))
              (
              (= tmp null nil (+ A B))
              (# nil (= OUT null nil tmp) nil 10) ))
          nil
          (A B)) )
    <ModuleInfo *ADDER> )
  )
ADD_test ; =
    (IDNT <Declaration *ADD_test> nil nil "ADD_test")
U1 ; =
    (IDNT <Declaration *U1> nil nil "U1")
IN0 ; =
    (IDNT <Declaration *IN0> nil nil "IN0")
IN1 ; =
    (IDNT <Declaration *IN1> nil nil "IN1")
SUM ; =
    (IDNT <Declaration *SUM> nil nil "SUM")
ADDER ; =
    (IDNT <Declaration *ADDER> nil nil "ADDER")
ADDER_LABEL ; =
    (IDNT <Declaration *ADDER_LABEL> nil nil "ADDER_LABEL")
OUT ; =
    (IDNT <Declaration *OUT> nil nil "OUT")
A ; =
    (IDNT <Declaration *A> nil nil "A")
B ; =
    (IDNT <Declaration *B> nil nil "B")
```

Fig. 11

```
<link_result1> ; =
(
(_MODU ADD_test null
       (GLOBAL_SIMVAR
        (_REG  IN0 7 0)
        (_REG IN1 7 0)
        (_WIRE SUM 7 0))

(_INST ADDER U1 (SUM IN0 IN1))

(_INIT
          ($monitor $TIM "%d + %d -> %d" IN0 IN1 SUM))

(_INIT
        (= IN0 1)
        (= IN1 2)
        (# 500)
        (= IN0 10)
        (= IN1 20)
        (# 100)
        (= IN0 32)
        (= IN1 40)
        (# 600)
        (= IN0 0)
        (= IN1 5)
        (# 800)
        (= IN0 10)
        (# 100)
        (= IN1 20)
        (# 600)
        (= IN0 15)
        (# 5)
        (= IN1 100)
        (# 5)
        (= IN0 2)
        (# 500)
        ($stop 2)
        ($finish 2)))

(_MODU ADDER (OUT A B)
       (GLOBAL_SIMVAR
        (_OTPT OUT 7 0)
        (_INPT A 7 0)
        (_INPT B 7 0)
        (_REG OUT 7 0))

(LOCAL_SIMVAR ADDER_LABEL
              (_REG tmp 7 0))

(_ALWY
  (@ (A B))
  (= ADDER_LABEL_tmp (+ A B))
  (# 10)
  (= OUT ADDER_LABEL_tmp))))
```

Fig. 12

SAMPLE INPUT
```
(_INIT
  (= IN0 1)
  (= IN1 2)
  (# 500)
  (= IN0 10)
  (= IN1 20)
  (# 100)
  (= IN0 32)
  (= IN1 40)
  (# 600)
  (= IN0 0)
  (= IN1 5)
  (# 800)
  (= IN0 10)
  (# 100)
  (= IN1 20)
  (# 600)
  (= IN0 15)
  (# 5)
  (= IN1 100)
  (# 5)
  (= IN0 2)
  (# 500)
  ($stop 2)
  ($finish 2) )
```

SAMPLE RESULT
```
(_INIT (IN0 IN1) nil
  (Sequencial (= IN0 1) (= IN1 2) )
  (# 500)
  (Sequencial (= IN0 10) (= IN1 20) )
  (# 100)
  (Sequencial (= IN0 32) (= IN1 40) )
  (# 600)
  (Sequencial (= IN0 0) (= IN1 5))
  (# 800)
  (Sequencial (= IN0 10) )
  (# 100)
  (Sequencial (= IN1 20) )
  (# 600)
  (Sequencial (= IN0 15) )
  (# 5)
  (Sequencial (= IN1 100) )
  (# 5)
  (Sequencial (= IN0 2) )
  (# 500)
  (Sequencial ($stop 2) ($finish 2) ) )
```

Fig. 13

```
<link_result2> ; =
(
    (_MODU ADD_test null
        (GLOBAL_SIMVAR
            (_REG  IN0  7 0 EVENTED)        ⎤
            (_REG  IN1  7 0 EVENTED)        ⎬ 11a
            (_WIRE SUM  7 0 EVENTED))       ⎦

(_INST ADDER U1 (SUM IN0 IN1))
                                            ← 12b
        (_INIT nil (IN0 IN1 SUM)
          (Sequencial
            ($MONITOR $TIME "%d + %d -> %d" IN0 IN1 SUM)))
                                    ← 12b
        (_INIT (IN0 IN1) nil
          (Sequencial (= IN0 1) (= IN1 2))       ← 13a
          (# 500)
          (Sequencial (= IN0 10) (= IN1 20))     ← 13a
          (# 100)
          (Sequencial (= IN0 32) (= IN1 40))     ← 13a
          (# 600)
          (Sequencial (= IN0 0) (= IN1 5))       ← 13a
          (# 800)
          (Sequencial (= IN0 10))                ← 13a
  13b ⎢ (# 100)
          (Sequencial (= IN1 20))                ← 13a
          (# 600)
          (Sequencial (= IN0 15))                ← 13a
          (# 5)
          (Sequencial (= IN1 100))               ← 13a
        ↓ (#5)
          (Sequencial (= IN0 2))                 ← 13a
          (#500)
          (Sequencial ($stop 2) ($finish 2))))   ← 13a (_MODU ADDER (OUT A B)
        (GLOBAL_SIMVAR
            (_OTPT OUT 7 0 REGISTERED)      ⎤
            (_INPT A 7 0)                   ⎪
            (_INPT B 7 0))                  ⎬ 11a
                                            ⎪
        (LOCAL SIMVAR ADDER_LABEL           ⎪
                (_REG tmp 7 0))             ⎦
             12b
              ↑
        (_ALWY (OUT tmp) ( A B ADDER_LABEL_tmp)
          (@ (A B))
  13b⎢   (Sequencial (= ADDER_LABEL_tmp (+ A B)))  ← 13a
       ↓ (# 10)
          (Sequencial (= OUT ADDER_LABEL_tmp)))))  ← 13a
```

Fig. 14

```
<link_result3> ; -
(
(TopModule (ADD_test))
(_MODU ADD_test
    (initializeModule
        (CreateSimVar IN0 REG 7 0 EVENTED)
        (CreateSimVar IN1 REG 7 0 EVENTED)  } 11a
        (CreateSimVar SUM WIRE 7 0 EVENTED)
        (CreateInstance ADDER U1 (SUM IN0 IN1))
        (CreateEvent initial0)
        (CreateEvent initial1))

(defInitialBlock initial0
        (scopeSimVar IN0)
        (scopeSimVar IN1) } 12b
        (scopeSimVar SUM)
        (Sequencial
            ($MONITOR nil nil ($TIM nil nil nil ) "%d + %d ->%d" IN0 IN1 SUM)))

(defInitialBlock initial1
        (scopeSimVar IN0) } 12b
        (scopeSimVar IN1)
        (Sequencial (SetLValue IN0 1) (SetLValue IN1 2) )
14a → (setDelay 500)
15a → (callScheduler WaitDelay) ] 14a+15a
        (Sequencial (SetLValue IN0 10) (SetLValue IN1 20) )
14a → (setDelay 100)
15a → (callScheduler WaitDelay) ] 14a+15a
        (Sequencial (SetLValue IN0 32)  (SetLValue IN1 40) )
14a → (setDelay 600)
15a → (callScheduler WaitDelay) ] 14a+15a
        (Sequencial (SetLValue IN0 0)  (SetLValue IN1 5) )
14a → (setDelay 800)
15a → (callScheduler WaitDelay) ] 14a+15a
        (Sequencial (setLvalue IN0 10) )
14a → (setDelay 100)
15a → (callScheduler WaitDelay) ] 14a+15a
        (Sequencial (SetLValue IN1 20) )
14a → (setDelay 600)
15a → (callScheduler WaitDelay) ] 14a+15a
        (Sequencial (SetLValue IN0 15) )
14a → (setDelay 5)
15a → (callScheduler WaitDelay) ] 14a+15a
        (Sequencial (SetLValue IN1 100) )
14a → (setDelay 5)
15a → (callScheduler WaitDelay) ] 14a+15a
        (Sequencial (SetLValue IN0 2) )
14a → (setDelay 500)
15a → (callScheduler WaitDelay) ] 14a+15a
        (Sequencial ($stop 2) ($finish 2) ) )
)

(_MODU ADDER (OUT A B)
    (initializeModule
        (SetSimVar OUT OTPT 7 0 EVENTED REGISTERED)
        (SetSimVar A INPT 7 0 EVENTED)               } 11a
        (SetSimVar B INPT 7 0 EVENTED)
        (CreateSimVar ADDER_LABEL_tmp REG 7 0 nil)
        (CreateEvent always0) )

(defAlwaysBlock always0
        (scopeSimVar OUT)
        (scopeSimVar A) ] 12b
        (scopeSimVar B)
        (scopeSimVar ADDER_LABEL_tmp)
14a [ (setEvent A)
      (setEvent B)          ] 14a+15a
15a → (callScheduler WaitEvent)
        (Sequencial (SetLValue ADDER_LABEL_tmp (+ A B)) )
14a → (setDelay 10)
15a → (callScheduler WaitDelay) ] 14a+15a
        (Sequencial (SetLValue OUT ADDER_LABEL_tmp) ) ) )
```

Fig. 15A
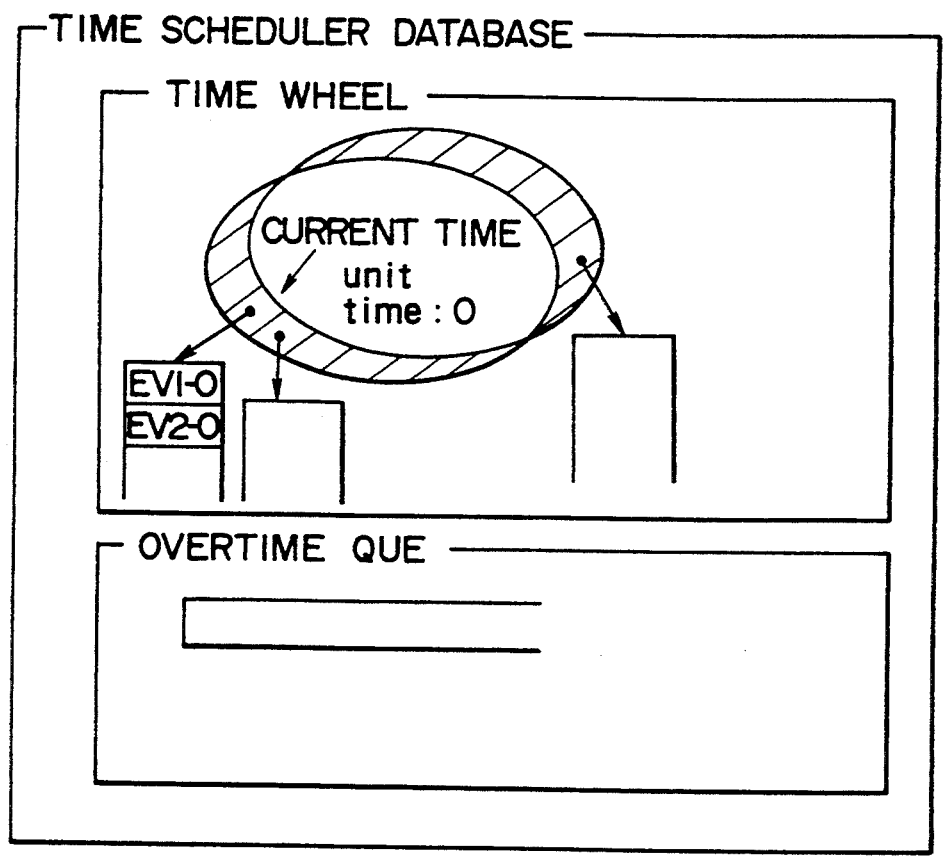
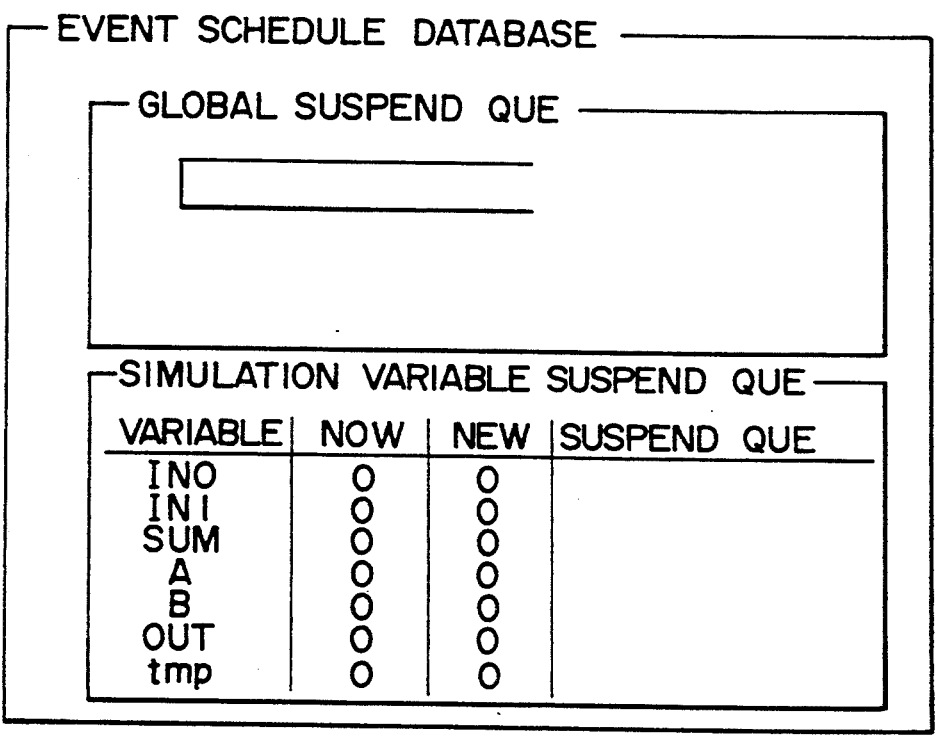

Fig. 15F
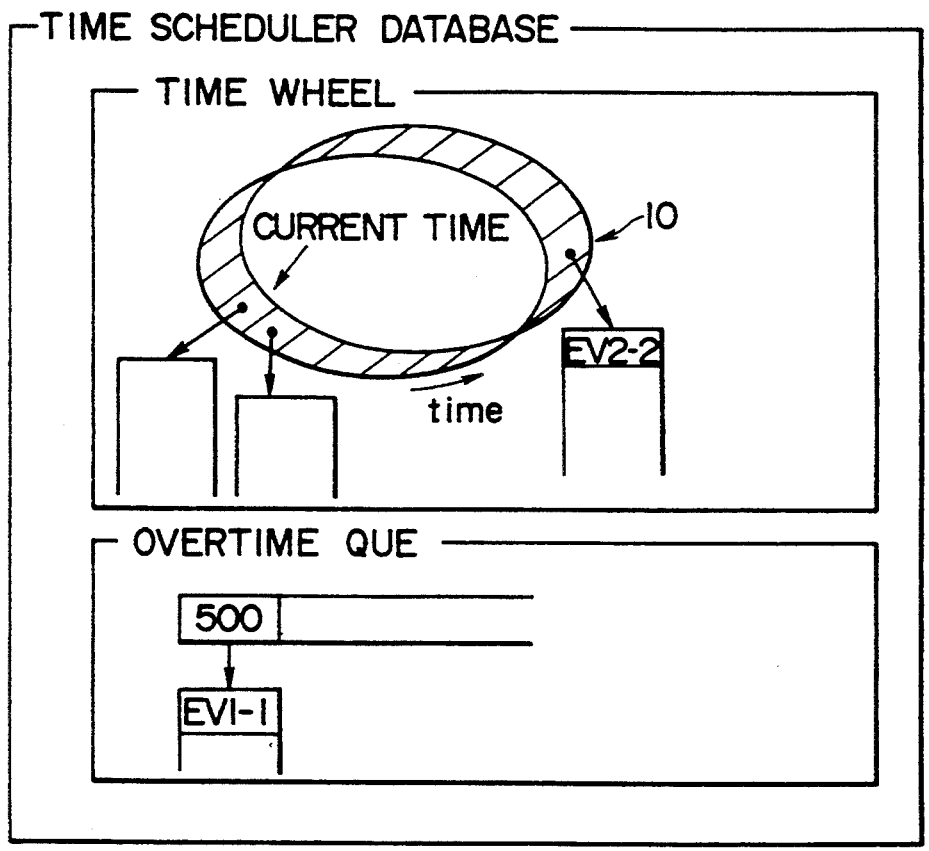
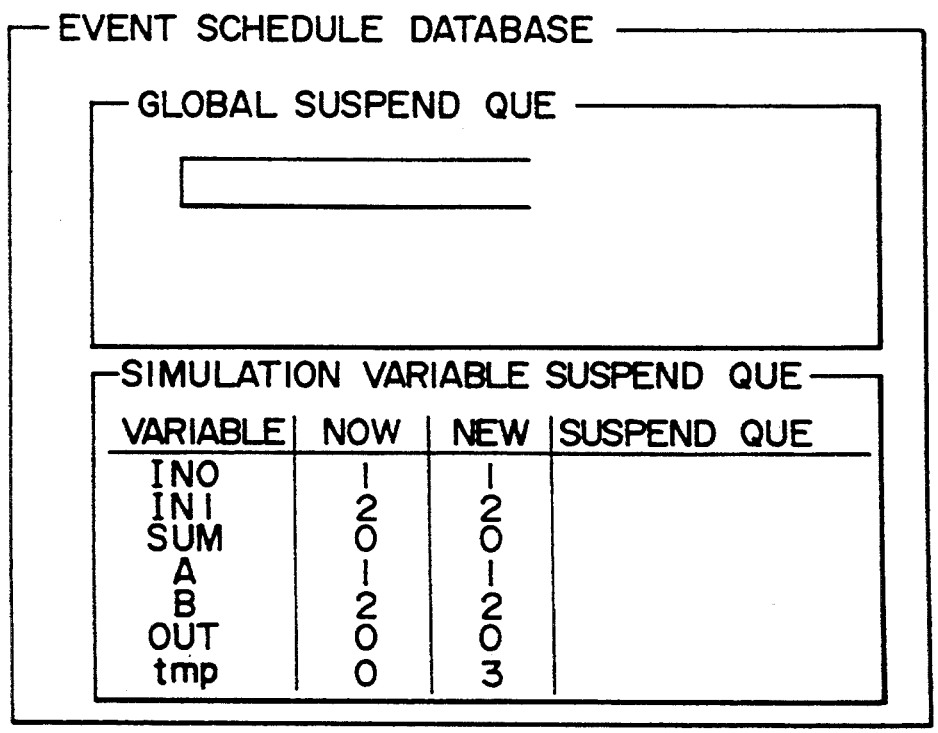

Fig. 15I
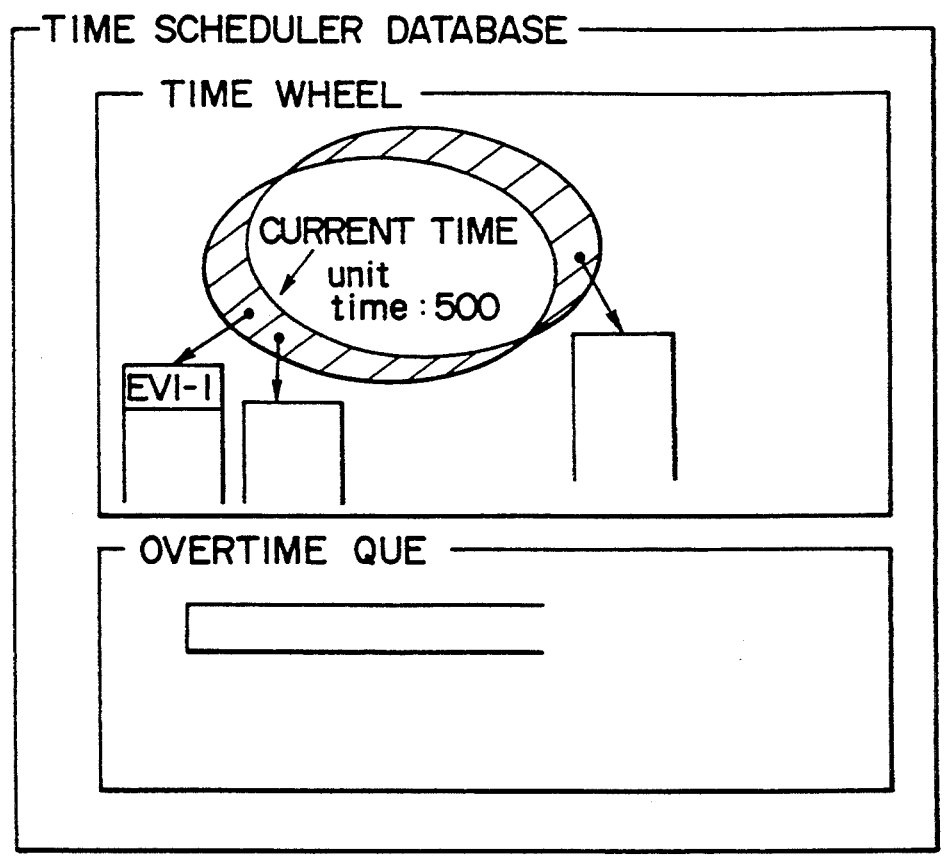
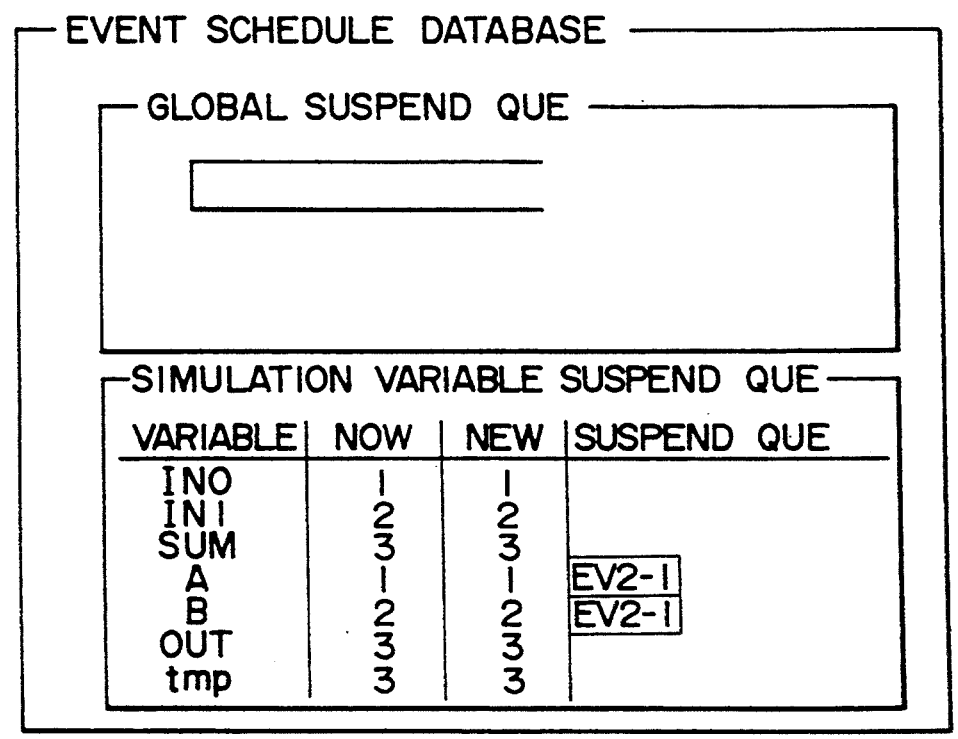

SIMULATION USING COMPILED FUNCTION DESCRIPTION LANGUAGE

BACKGROUND OF THE INVENTION

1. Field of the Invention

This invention generally relates to a simulation method and apparatus, and, in particular, to a method and system for converting a simulation program written by a function description language into a compiled simulation program which is suitable for use in verifying the operation, function, logic of a circuit, such as a semiconductor integrated circuit and an electronics circuit, and a system in the field of CAD (computer Aided Design).

2. Description of the Prior Art

Because of the recent technological advancement in the ASIC technology, it is now possible to design an integrated circuit having 1 million gates. It is virtually impossible to design such a high density IC manually and the recent trend is to use the so-called top-down design technique. Ideally speaking, in designing an IC based on the top-down scheme, a programming language is used at the initial stage and the subsequent steps are carried out automatically. However, in reality, not all of the subsequent steps are automated and the typical current top-down design proceeds as follows.
1. Determination of specification
2. System design
3. Function design
4. Logic design
5. Layout design In designing the function at step 3 above, use is made of the function description language, and using this as an input, a function simulation is carried out to verify the functionality of the designed function. The function description language is the language designed to describe the specification of a circuit to be designed. The use of such a function description language is advantageous because designing can be carried out without relying on a particular technology and in addition designing can be carried out commensurate with the manner of thinking of a human being. The function description language is a high level language like a programming language, such as the C language, so that a function can be described without determining an actual circuit.

The currently most commonly used function description languages are VHDL (IEEE standard, system 1076) and Verilog-HDL. The Verilog-HDL is currently more used and a simulator called Verilog-XL is also available for effecting simulation using the Verilog-HDL language.

In the Verilog-HDL, all of the functions are defined in a modular form, and each module is defined between a pair of reserved words "module" and "endmodule." as shown in FIG. 1. A plurality of modules may be provided in sequence and the modules may be arranged in a hierarchical structure. Each module has an input and an output, through which data can be exchanged with another module. Each module may have three kinds of in-module descriptions, i.e., (1) declaration of variables (input, output, reg, integer, etc.), (2) instance definition and (3) behavior description. When a module is nested in another module, the nested module is called an instance.

There are four kinds of the in-module behavior description and they are (1) "initial", (2) "always", (3) "task" and (4) "function" blocks. The "initial" block is an execution unit which is executed only once upon initiation of simulation. The "always" block is an execution unit which is repeatedly executed upon initiation of simulation. The "task" block is an execution unit which is called by the "initial" and "always" blocks. The "function" block is a function unit which is called by the "initial" and "always" blocks. A specific module modeling an ADDER described using the Verilog-HDL is illustrated in FIG. 2 as an example.

The main feature of Verilog-HDL resides in its ability to carry out a parallel processing operation. The in-module "initial" and "always" blocks constitute parallel processing units. In order to support the parallel processing of each of the modules, use is made of two parallel process control functions, i.e., (1) event control function and (2) delay control function. A statement starting with symbol "@" defines an event control function, and its function is to halt the processing of a block under execution until a trigger activated by another parallel block has arrived. On the other hand, a statement starting with symbol "#" defines a delay control function, and its function is to halt the execution of its block over a designated period of time.

Since such parallel processing control functions are provided, a number of modules can be executed properly without any interference. However, a program written by the Verilog-HDL can be executed only in an interpreter mode as it is, such as the BASIC language, so that it takes an exorbitant amount of time for execution. As the circuit to be designed becomes more complicated, the execution time increases significantly beyond a tolerable limit. A similar situation exists in the remaining function description language, so that there has been a need to devise a method and apparatus for increasing the speed of execution of a program written by the function description language.

SUMMARY OF THE INVENTION

In accordance with one aspect of the present invention, there is provided a method for converting a simulation program written by a function description language into an executable program written by a selected programming language, comprising the steps of:

preparing a simulation program written by a function description language and including sequential and parallel process variables;

discriminating the parallel process variables from the sequential process variables in said simulation program;

converting the parallel process variables into corresponding sequential process variables, thereby converting said simulation program into an intermediate program free of the parallel process variables; and converting said intermediate program into an executable program using a predetermined scheduler which controls a sequence of occurrence of events as a function of simulation time.

In accordance with another aspect of the present invention, there is provided a system for converting a simulation program written by a function description language into an executable program written by a selected programming language, comprising:

storing means for storing a simulation program written by a function description language and including sequential and parallel process variables;

discriminating means for discriminating the parallel process variables from the sequential process variables in said simulation program;

converting means for converting the parallel process variables into corresponding sequential process variables in accordance with a predetermined manner, thereby defining an intermediate program free of said parallel process variables; and converting means for converting said intermediate program into an executable program using a predetermined scheduler which controls a sequence of occurrence of events as a function of simulation time.

It is therefore a primary object of the present invention to provide a high-speed simulation method and apparatus.

Another object of the present invention is to provide a method and system for converting a simulation program written by a function description language, such as Verilog-HDL into a compiled, executable program written by a selected programming language, such as the C language.

Other objects, advantages and novel features of the present invention will become apparent from the following detailed description of the invention when considered in conjunction with the accompanying drawings.

BRIEF DESCRIPTION OF THE DRAWINGS

FIG. 2 is an illustration showing a typical module written by the Verilog-HDL language for modeling an adder;

FIG. 8 is an illustration showing an example of an HDL file written by the Verilog-HDL language including an ADDER module and its test module;

FIG. 9 is an illustration showing an example of the result obtained by processing the HDL file shown in FIG. 8 through a syntax analysis;

FIG. 11 is an illustration showing the result of modifying the data shown in FIG. 9 by decomposing each line of statement into elements suitable for computer processing;

FIG. 12 is an illustration showing how the sequential and parallel process variables are discriminated;

FIG. 13 is an illustration showing the result of discrimination between the sequential and parallel process variables;

FIG. 14 is an illustration showing the result of converting the parallel process variables into predetermined corresponding sequential process variables; and FIGS. 15-1 through 15-9 are illustrations useful for explaining the structure and function of the scheduler 106a or 19a.

DESCRIPTION OF THE PREFERRED EMBODIMENTS

In accordance with the principle of the present invention, an HDL program or file written by the Verilog-HDL language using a text editor is converted into a C source file so that the C source file can be compiled using the C language compiler. When compiled, the simulation can be carried out at high speed as compared with the case in which the HDL program is run as it is.

The present HDL-C conversion process includes the following sequence of steps.

(1) syntax analysis
(2) element decomposition
(3) scheduler control separation (discrimination between sequential and parallel process variables)
(4) scheduler control conversion (conversion of parallel process variable into corresponding sequential process variables)
(5) compile and link In the first place, an HDL file must be created by the Verilog-HDL language using a text editor. Such an HDL file may be entered into a work station schematically shown in FIG. 6. If a text editor is present in the work station, then such an HDL file may be created directly at the work station.

Figure 1:
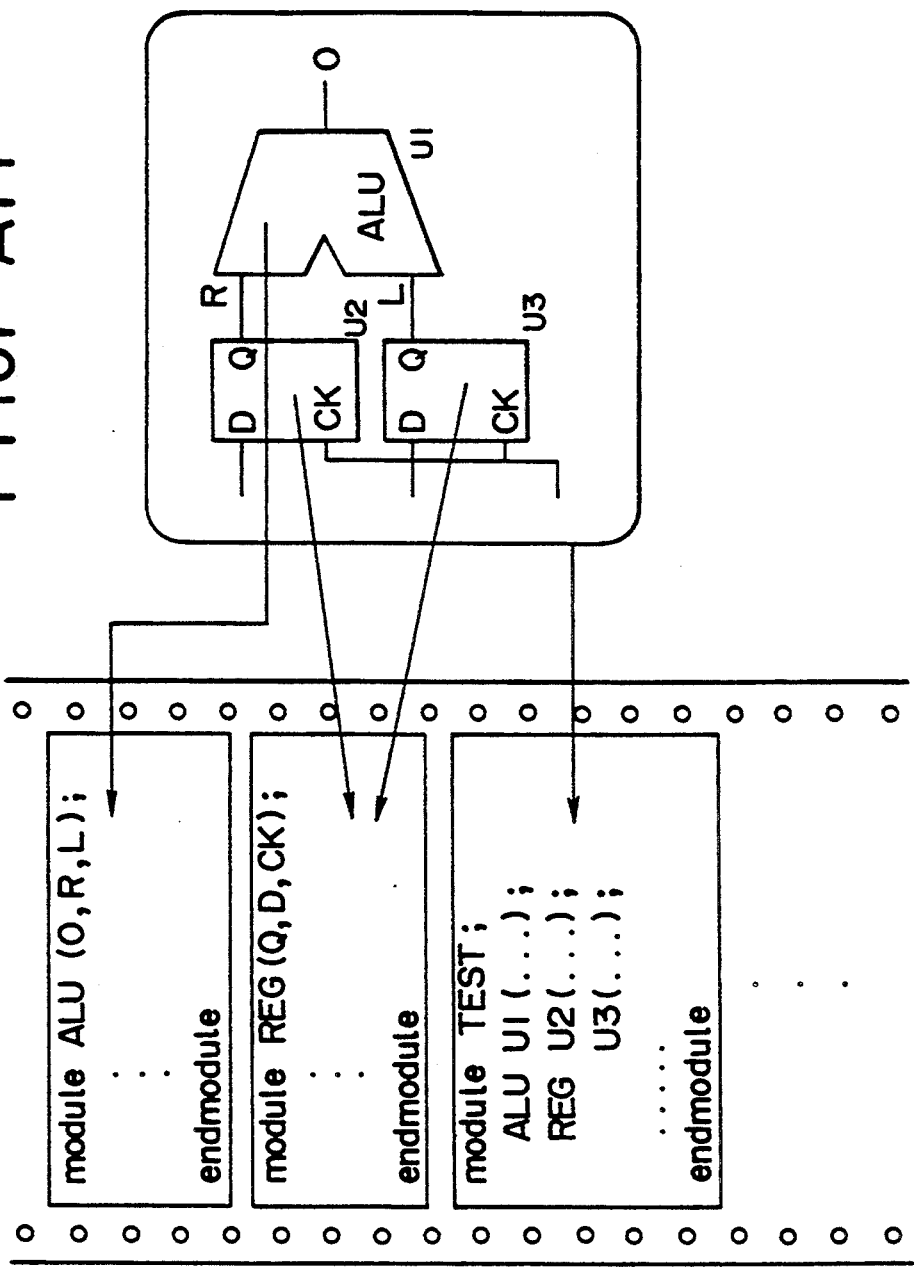
FIG. 1 is a schematic illustration showing a typical simulation program written by the Verilog-HDL language for designing an integrated circuit.
Figure 3:
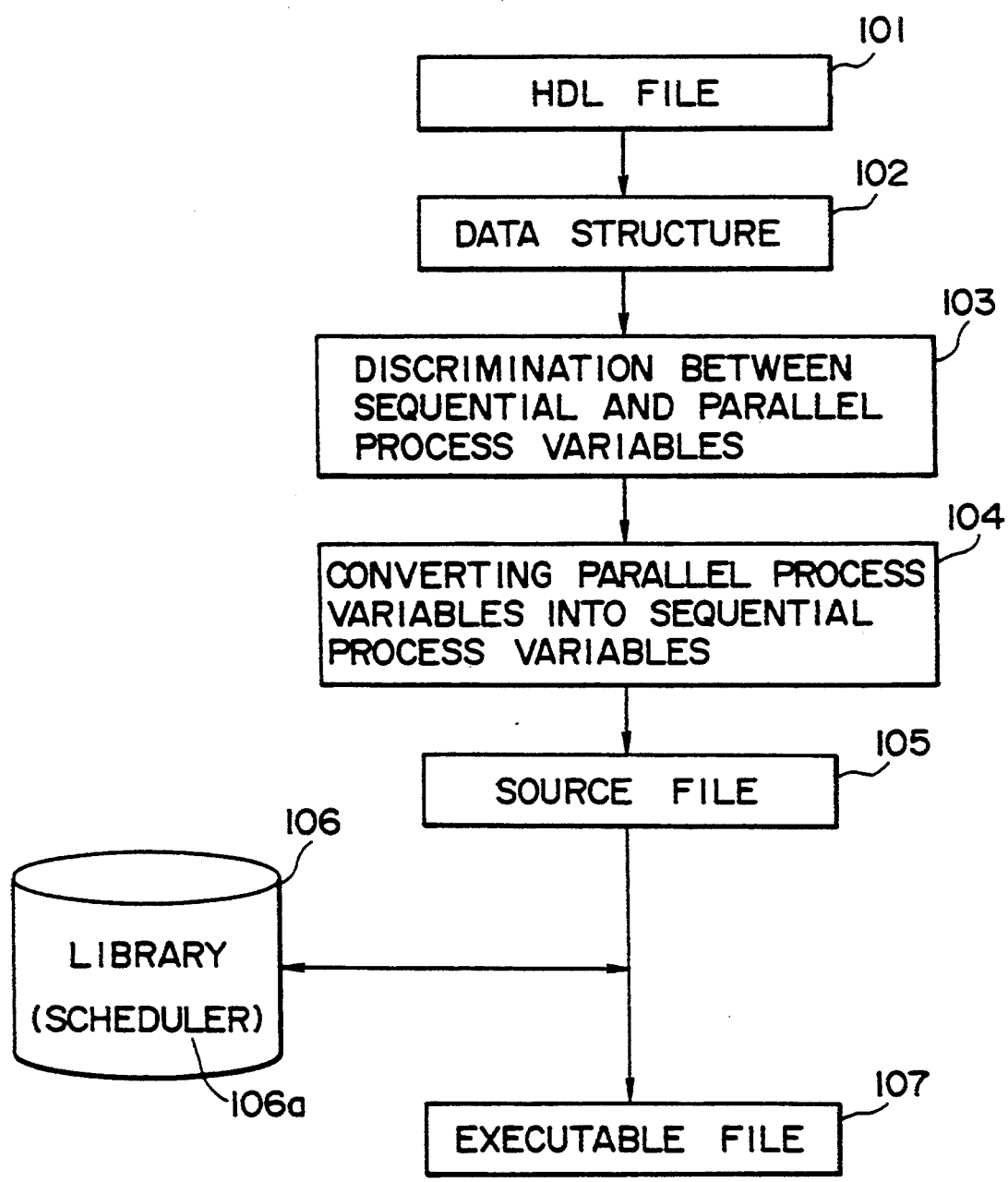
FIG. 3 is a flow chart showing a sequence of steps for converting an HDL file written by the Verilog-HDL language into a compiled, executable file written by the C language according to the principle of the present invention.
Figure 7:
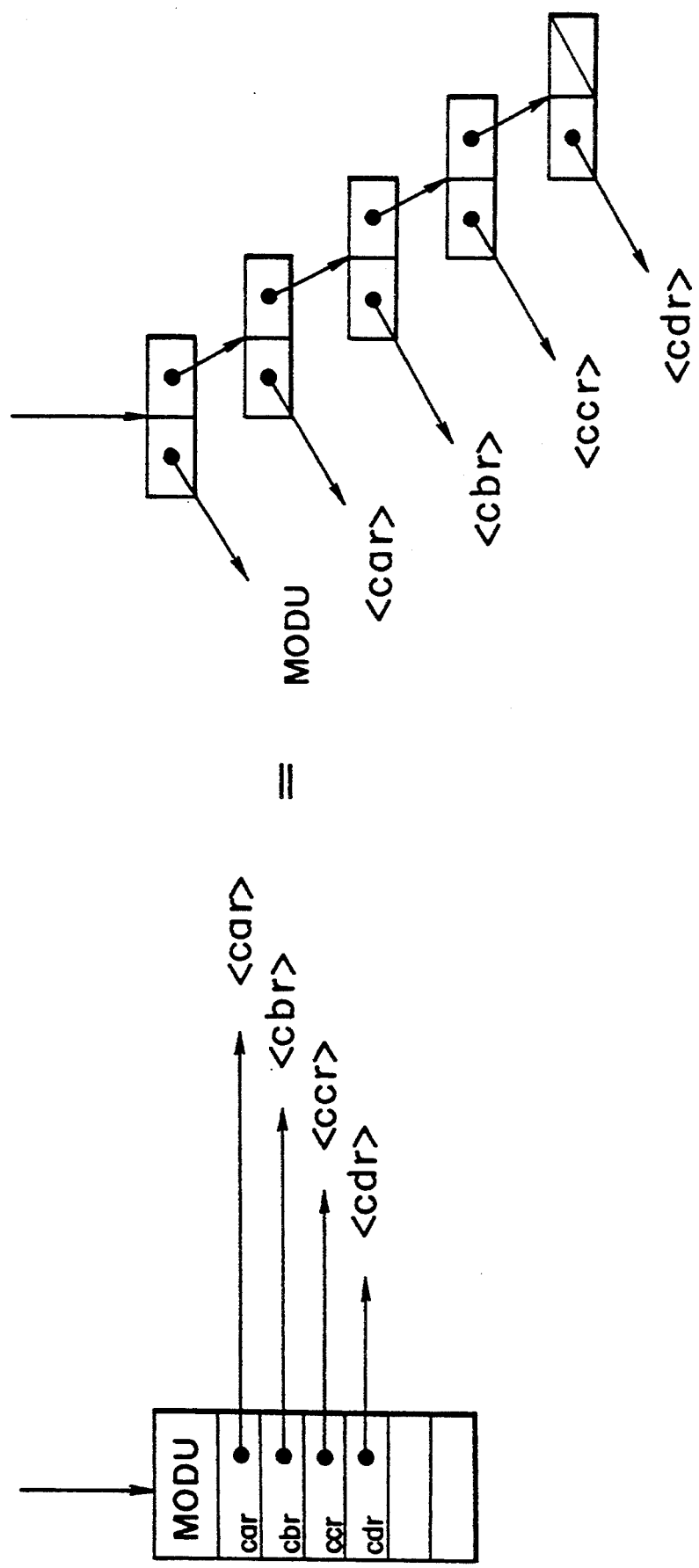
FIG. 7 is an illustration showing the equivalency between a quarterly tree and a binary tree as a node of a data structure.

Referring now to FIG. 3, the HDL file thus created is then subjected to syntax analysis (including lexical analysis) and then the elements of the HDL file are decomposed according to a predetermined format so as to redefine a database which is more suitable for processing in a computer. As a result, there is obtained a data structure, or database having a quarterly tree structure, as shown at block 102 in FIG. 3. The quarterly tree structure is a modification of a well-known binary tree structure and their correspondence is illustrated in FIG. 7.

Then, the database thus redefined is subjected to a scheduler control separation operation, whereby classification or discrimination is made between the parallel process variables, which require involvement of a scheduler 106a because the scheduler controls the occurrence of events as a function of time and the parallel process variables are activated dependent upon the occurrence of associated events, and the sequential process variables, which do not require involvement of the scheduler 106a. The sequential process variables may be converted into a C source file directly since all of the variables are sequential in nature. On the other hand, the parallel process variables or event driven variables, such as those including "@" and "#", cannot be converted into a C source file directly since they are not sequential in nature. As a result, those parallel process variables must be converted into corresponding predetermined sequential process variables.

Therefore, at block 104 in FIG. 3, the parallel process variables, such as "@" and "#" in the HDL file, are converted into corresponding sequential process variables according to a predetermined scheme. As a result, there is obtained a C source file as shown at block 105 in FIG. 3. Then, the C source file is compiled and linked in association with a library 106 containing a predetermined scheduler 106a to produce a compiled, executable file as shown at 107 in FIG. 3. Based on this compiled, executable file, an intended simulation can be carried out at high speed under the control of the scheduler 106a.

As briefly described above, in accordance with the principle of the present invention, an HDL file modeling a desired logic function, such as an ADDER, is first created by a text editor using the Verilog-HDL language and the HDL file thus created is converted into a C-compiled file so that the intended simulation can be carried out at an extremely high speed.

Figure 6:
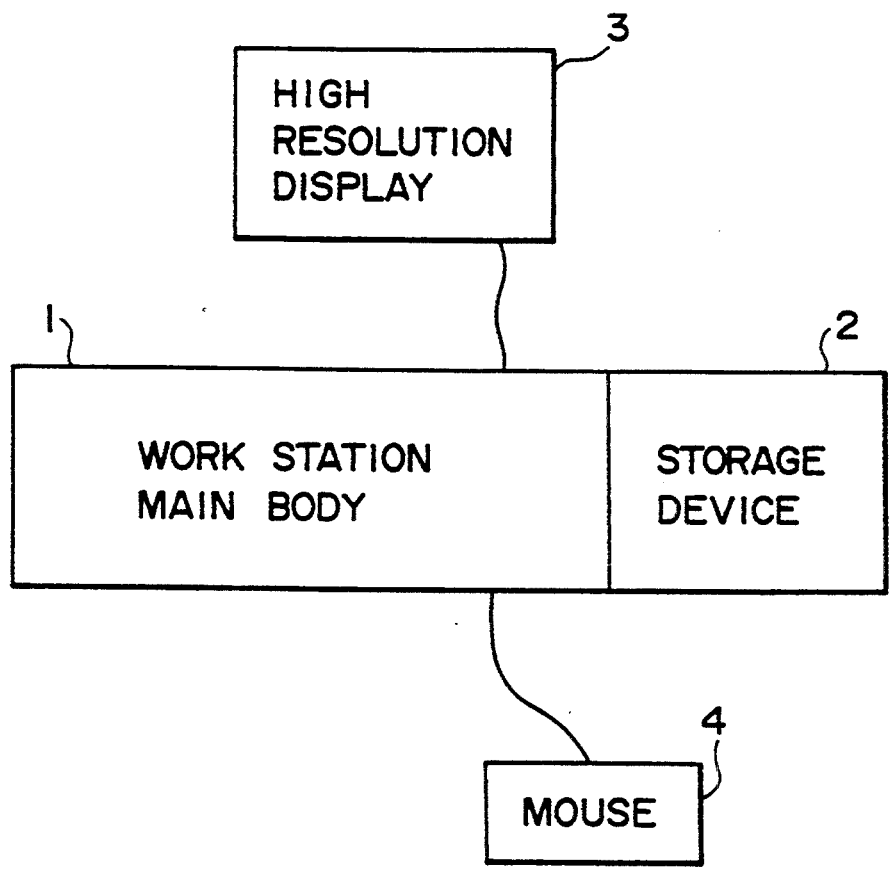
FIG. 6 is a schematic illustration showing the overall structure of a simulation apparatus constructed in accordance with one embodiment of the present invention.

The present invention may be incorporated into a work station as shown in FIG. 6, which includes a work station main body 1, a storage device 2, a high resolution display and a mouse 4. Any other peripheral devices, such as a keyboard may also be included, if desired. When the principle of the present invention has been incorporated in the work station shown in FIG. 6, then the storing device 2 will store a database having a predetermined data structure, such as the quarterly tree structure as described above. If a text editor is provided in the work station, then the HDL file may be created at the work station using the text editor.

The work station also includes means for classifying or discriminating parallel process variables, such as "@" and "#" in the case of the Verilog-HDL language, from sequential process variables contained in the database or data structure and means for converting the parallel process variables into corresponding sequential variables according to a predetermined scheme to thereby produce a C source file. These discriminating and converting means may take the form of software routines stored in the storing device 2. The C compiler is also stored in the storing device 2 for compiling and linking the C source file to produce a compiled, executable file.

In the preferred embodiment described above, although use has been made of the C language as the programming language, any other compiler type or ALGOL type languages, such as PASCAL, and AIDA, can also be used. Alternatively, use may also be made of the assembler language. Besides, use has been made of the Verilog-HDL language as the function description language in the above-described preferred embodiment, use may also be made of any other function description languages, such as VHDL or UDLI and HSLEX, both developed by NTT of Japan.

The sequential operation of the C-compiled file is controlled by the simulation scheduler 106a which may exist in the library 106. Alternatively, the scheduler 106a may also come into play when the C-source file 105 is assembled. With the involvement of the scheduler 106a, the simulation procedure is completely set in a sequential order. The scheduler 106a implements an event driven algorithm such that scheduling and processing is carried out with an event as a unit. The simulation time determines the scheduling order and it can proceed in the forward direction only and not in the reversed direction as in actual time. A concept of unit time is used in the simulation time of the present invention. The scheduler 106a built in the present invention has two basic functions, i.e., (1) time wait scheduling (in which case, an event is executed or activated after elapsing of a designated simulation time) and (2) event wait scheduling (in which case, an event is held in a standby status until a change occurs).

The basic unit on which scheduling is carried out according to the scheduler 106a of the present invention is an event, which is a unit of simulation process. The scheduler 106a only determines the order of processing of events and its activation without getting into the contents of the event.

As discussed before, all of the processing is carried out in the form of C-language functions in the preferred embodiment. Thus, the parallel blocks or variables inside a module of the HDL file, such as "initial" and "always" blocks, are treated as individual functions. In an event database, which will be described later in detail, a pointer pointing to a C-language function corresponding to an event is retained, and its function is called at the time when the event is activated.

In the case of the C language, there is only a single entry to a function. However, in the case where there is a syntax which starts with "@" or "#" in the HDL file and thus requires the involvement of the scheduler, there arises a necessity to resume processing in the middle of a designated function. In the present simulation scheme, a separate entry point is set within a C-language function derived from the HDL file so as to implement such function. In fact, it is so structured that an entry number is provided and all of the functions derived from the HDL file are first checked with their entry numbers, whereby the processing starts at a position where a selected entry number is present. Thus, in the event database, an entry number which is to be executed next is recorded.

The scheduler 106a includes a (1) time schedule database and an (2) event schedule database. The time schedule database is a database which manages the timing of events. The time schedule database includes two kinds of databases, i.e., a time wheel and an overtime que. Either of these databases has a function of holding an event until a designated time has come, but those events which will be executed relatively soon (the maximum unit time being 16 in the present embodiment) as from the current time are registered in the time wheel, whereas, the other events are registered in the overtime que. The reason why there are provided these two kinds of databases is to carry out sorting of activation times at the time of time scheduling at high speed.

The time wheel is a database having a plurality of event ques capable of registering a plurality of events and having a circular shape. The overtime que is a que capable of registering a plurality of the before-mentioned event ques and those events which have not been registered in the time wheel are registered in this database. An event que registered in the overtime que can designate the execution time of the event registered in the que.

The event schedule database is a database in which those events which wait for certain events and not for time are registered. There are two kinds of event wait events, one of which is an event which does not depend on the variables declared in the HDL file and which is used for controlling the internal operation and the other of which is an event which depends on the variables declared in the HDL file and which causes an event to be activated due to changes in the simulation variables. A global suspend que is a que which causes an event, which does not depend on the simulation variables, to be set in a wait status. A simulation variable suspend que is a que for registering those events which do not depend on the simulation variables.

Now, with reference to FIG. 4, one specific embodiment of the present invention will be described. In the first place, hardware description information 100 including netlist information regarding the connection relationship and hierarchical relationship among modules and behavioral information, such as "initial" and "always" statements, is stored into the storage device 2. The hardware description information may be the data structure or database 102 having a predetermined data tree structure shown in FIG. 3. The hardware description information is processed to classify or discriminate the sequential process units or variables 13a from the parallel process units or variables 13b. The sequential process variables may be processed by the computer as they are. However, the parallel process variables, such as those starting with symbol "@" or "#" in the case where the Verilog-HDL is used, cannot be processed by the computer as they are since conflicts may arise among these variables.

Then, among those parallel process units or variables which have just been discriminated or classified, there are those parallel process units or variables which contain sequential process units or variables. Thus, the parallel process units or variables 13b are again processed at step 14 to extract those parallel process units or variables 14a which have sequential process units or variables. For example, the discriminated parallel process unit may have a form of "#(A+10)", in which case the addition process in the parentheses, i.e., A+10, is a sequential process so that the "A+10" part is extracted as a sequential process 14a through the "#" part is classified as a parallel process or variable 14b. Then, the remaining parallel process variables, e.g., "@" and "#", are converted into predetermined corresponding sequential processes or variables 15a through step 15, which are defined as user-defined functions in the C language.

On the other hand, at step 11, the variables used in the statements starting with "@" or "#" in the hardware description information 100 are extracted to make a list of variables 11a. Then, it is examined at step 12 as to whether these variables are used in each of "initial" and "always" blocks, and those variables which are not used are removed from the database. In this manner, unnecessary variables are removed at step 12 to thereby provide an optimized list of variables 12b.

Now, using the optimized list of variables 12b and the sequential process units 13a, 14a and 15a, a programming language (C language in the present embodiment) conversion is carried out at step 16 so that there is obtained programming language description information 16a which corresponds to source file 105 written in the C language. Then, the C source file or programming language description information 16a is processed by a translator 17, such as a compiler and a linker, in association with a library 19, including the previously described scheduler 19a, to produce executable information 17a which can be directly executed by a computer 18. Therefore, the information 17a can be run in the computer in the compiled format under the control of the scheduler 19a and not in the interpreter format so that its execution can be carried out at extremely high speed.

Figure 4:
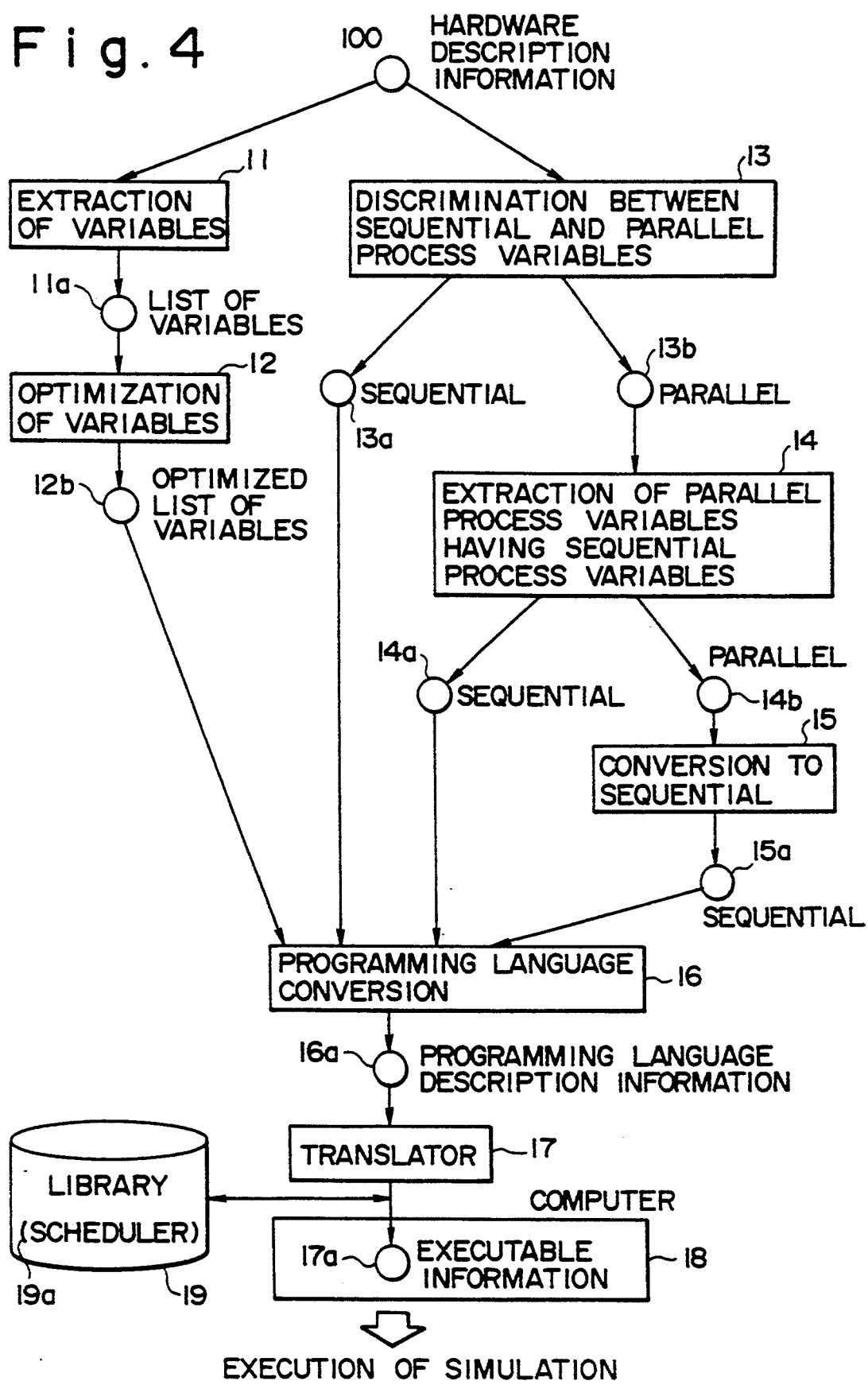
FIG. 4 is a schematic illustration showing a Verilog-HDL-to-C converting system for converting an HDL file into a C-compiled file according to one embodiment of the present invention.
Figure 5:
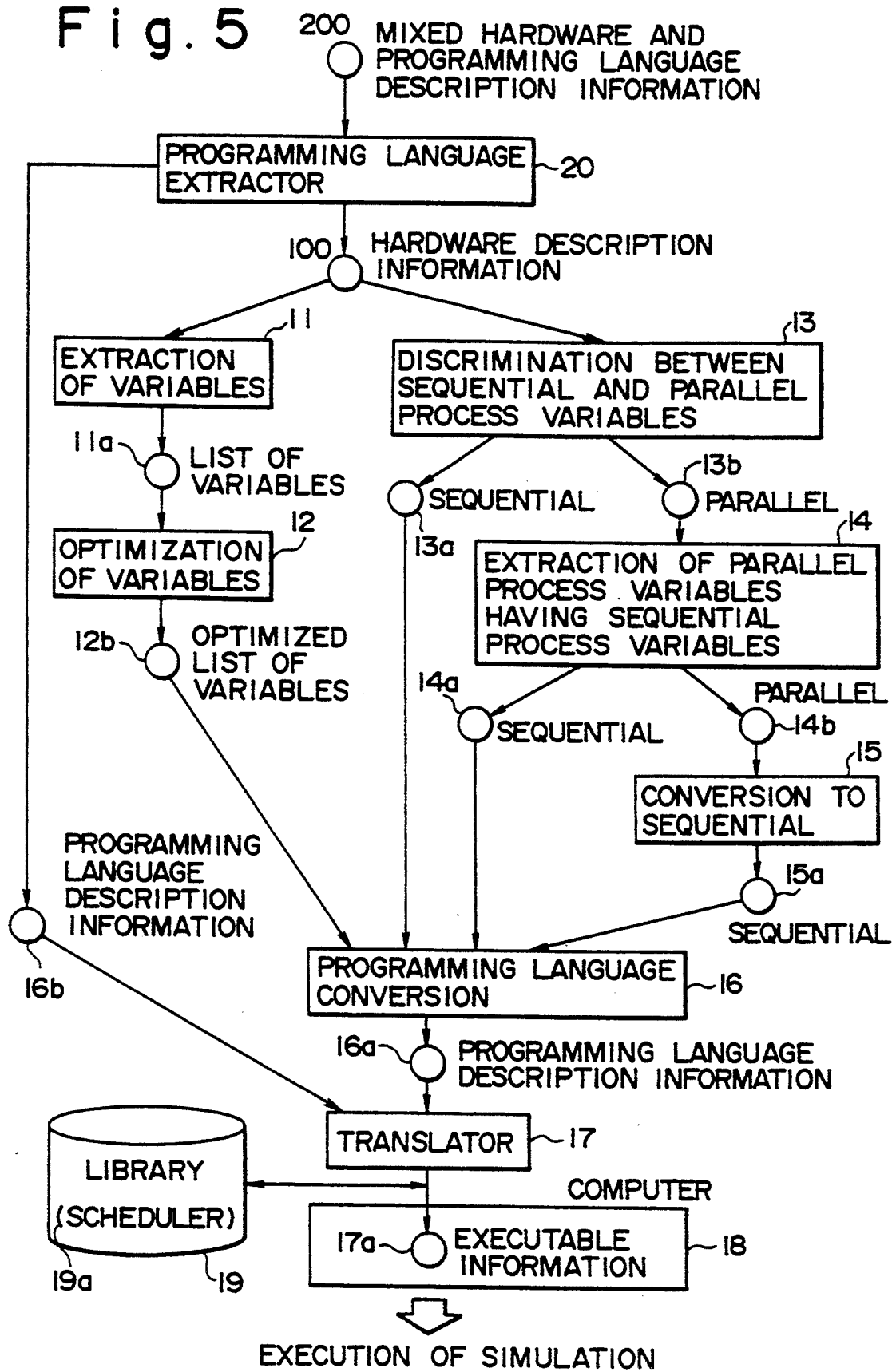
FIG. 5 is a schematic illustration showing a Verilog-HDL-to-C converting system for converting an HDL file into a C-compiled file according to another embodiment of the present invention.

FIG. 5 illustrates another specific embodiment of the present invention, which is similar in many respects to the above-described embodiment shown in FIG. 4 and thus like numerals indicate like elements. In the case of FIG. 5, mixed information 200 including both of hardware description information and programming language description information is first processed to extract the programming language description information 16b by a programming language extractor 20, and the thus extracted programming language description information 16b is supplied to the translator 17. The remaining information output from the programming language extractor 20 constitutes the hardware description information 100, which can be processed in the same manner as described with reference to FIG. 4.

Now, the present invention will be described more in detail using specific sample modules with reference to FIGS. 8 through 14. FIG. 8 illustrates a typical HDL file including an 8-bit input ADDER model and a test vector producing model for testing the ADDER model according to a specific embodiment of the present invention. The HDL file shown in FIG. 8 may be created directly at the work station 1 using a text editor, or such an HDL file may be created somewhere else and supplied into the work station 1. The ADDER model is defined between "module ADDER (OUT, A, B);" and "endmodule", and the test vector producing mode is defined between "module ADD test1;" and "endmodule." This HDL file corresponds to the HDL file 101 in FIG. 3.

The HDL file shown in FIG. 8 is then subjected to a syntax analysis, including a lexical analysis, to thereby convert the HDL file into a data structure or database having a predetermined tree structure as shown in FIG. 9. In the present example, the HDL file is converted into a connection structure of data elements (or node cells) having a quarterly tree as a unit. Thus, all of the reserved words are converted into a database structure and a series of letters described by the database thus produced become unique letters and symbols which are described in the HDL file and which do not depend on the language format. The resulting database or data structure corresponds to data structure 102 in FIG. 3 and also to hardware description information 100 in FIG. 4.

Figure 10:
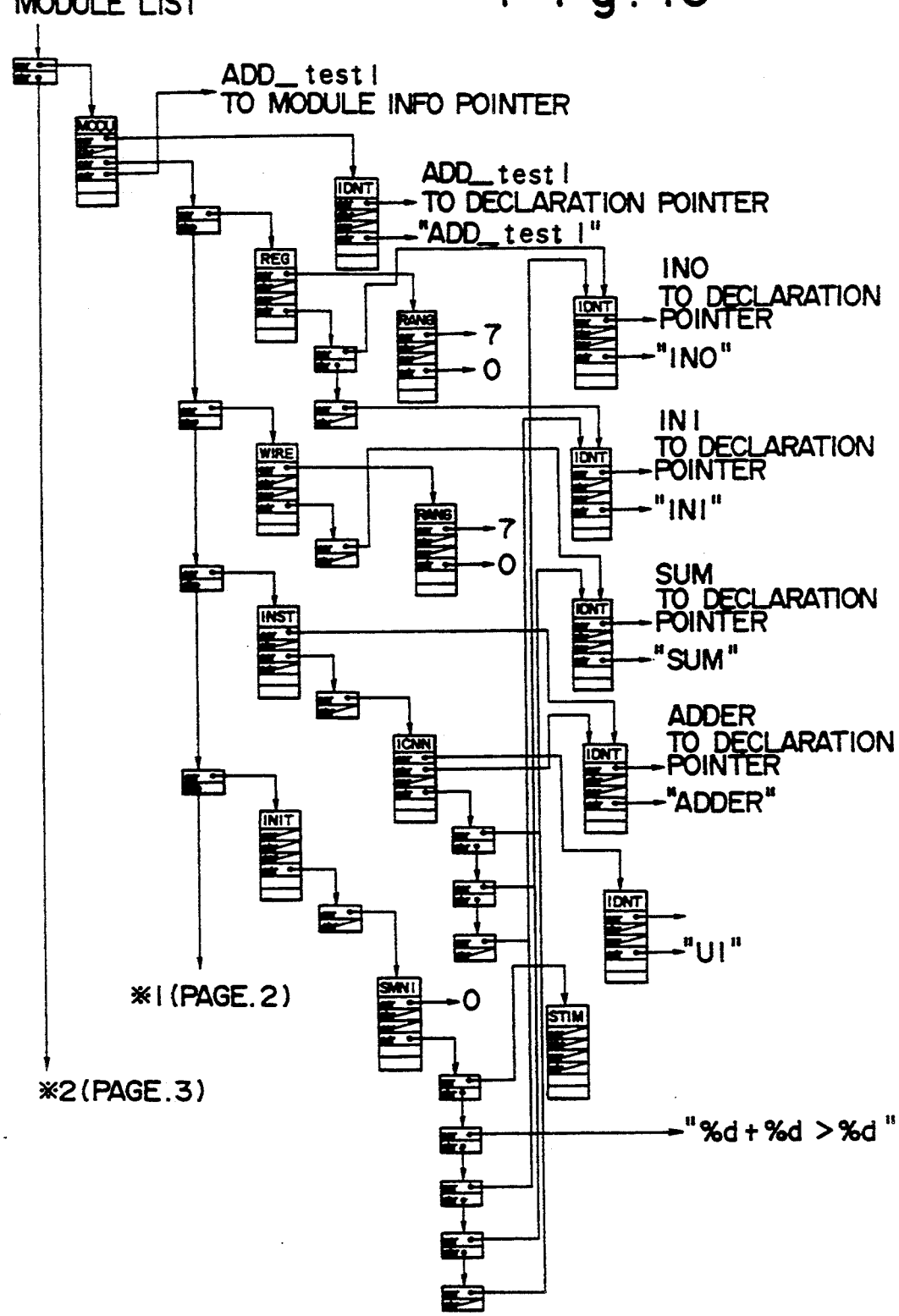
FIG. 10 is an illustration showing the data structure of the data shown in FIG. 9.
Figure 15B:
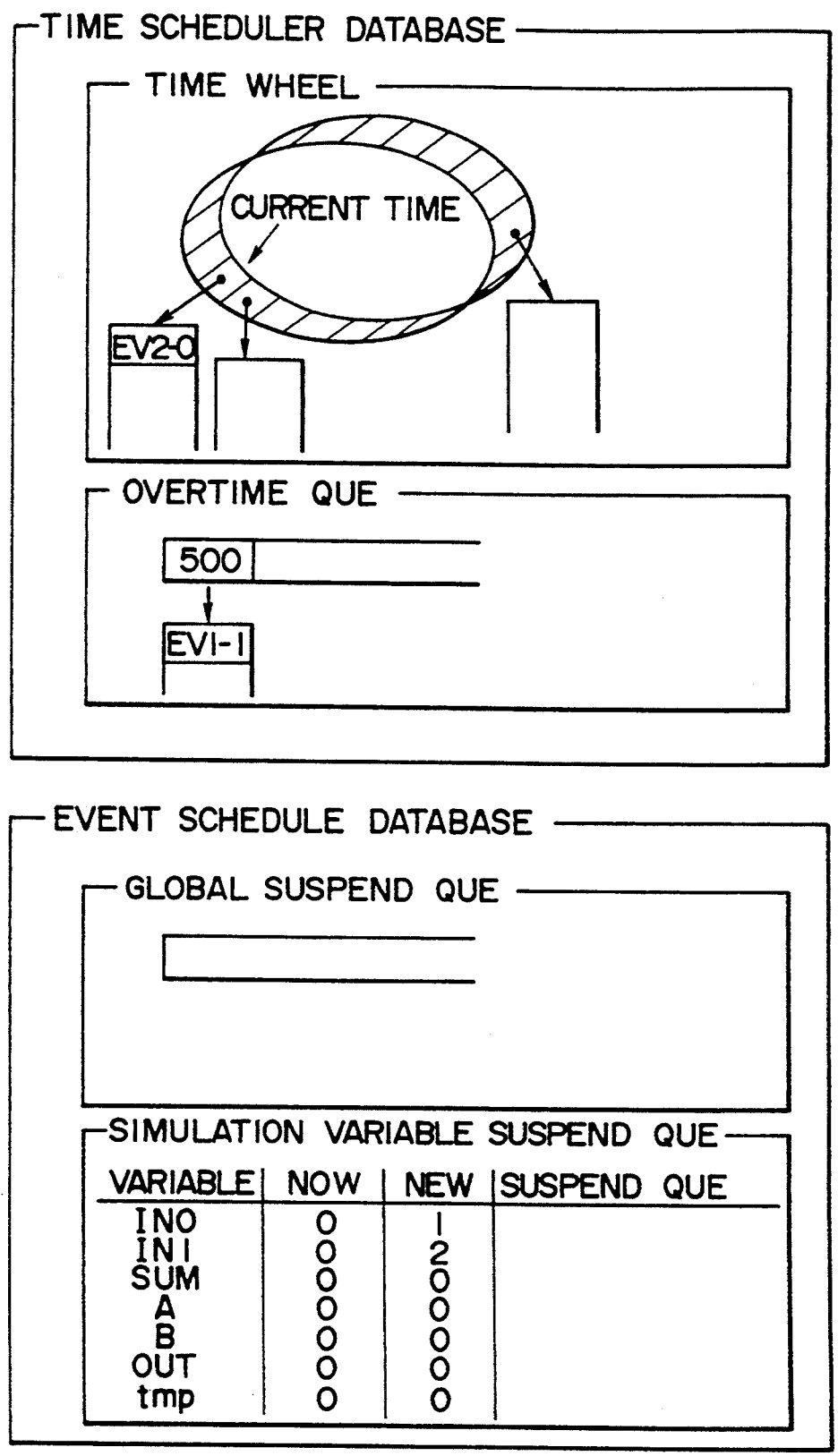
Figure 15C:
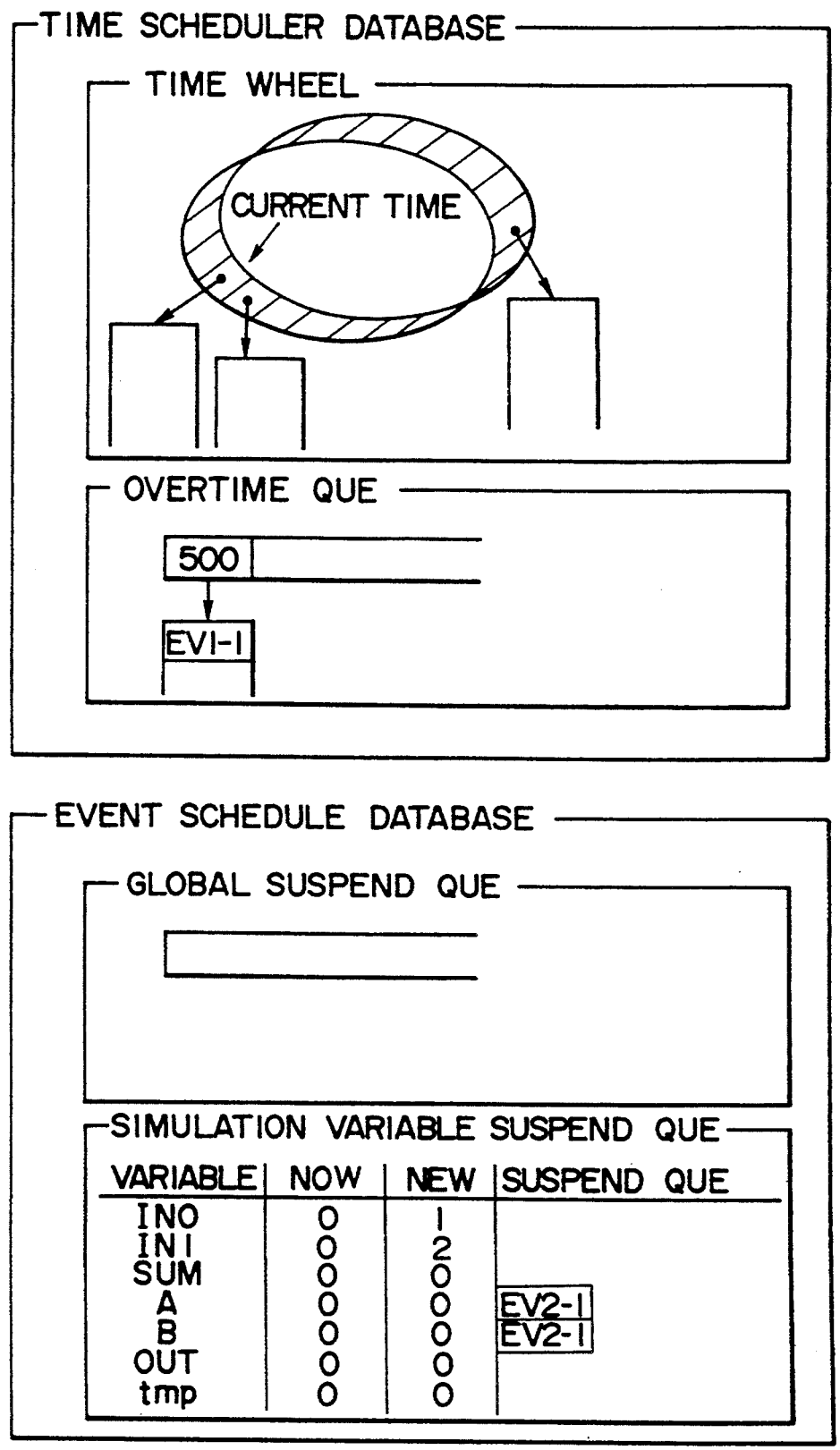
Figure 15D:
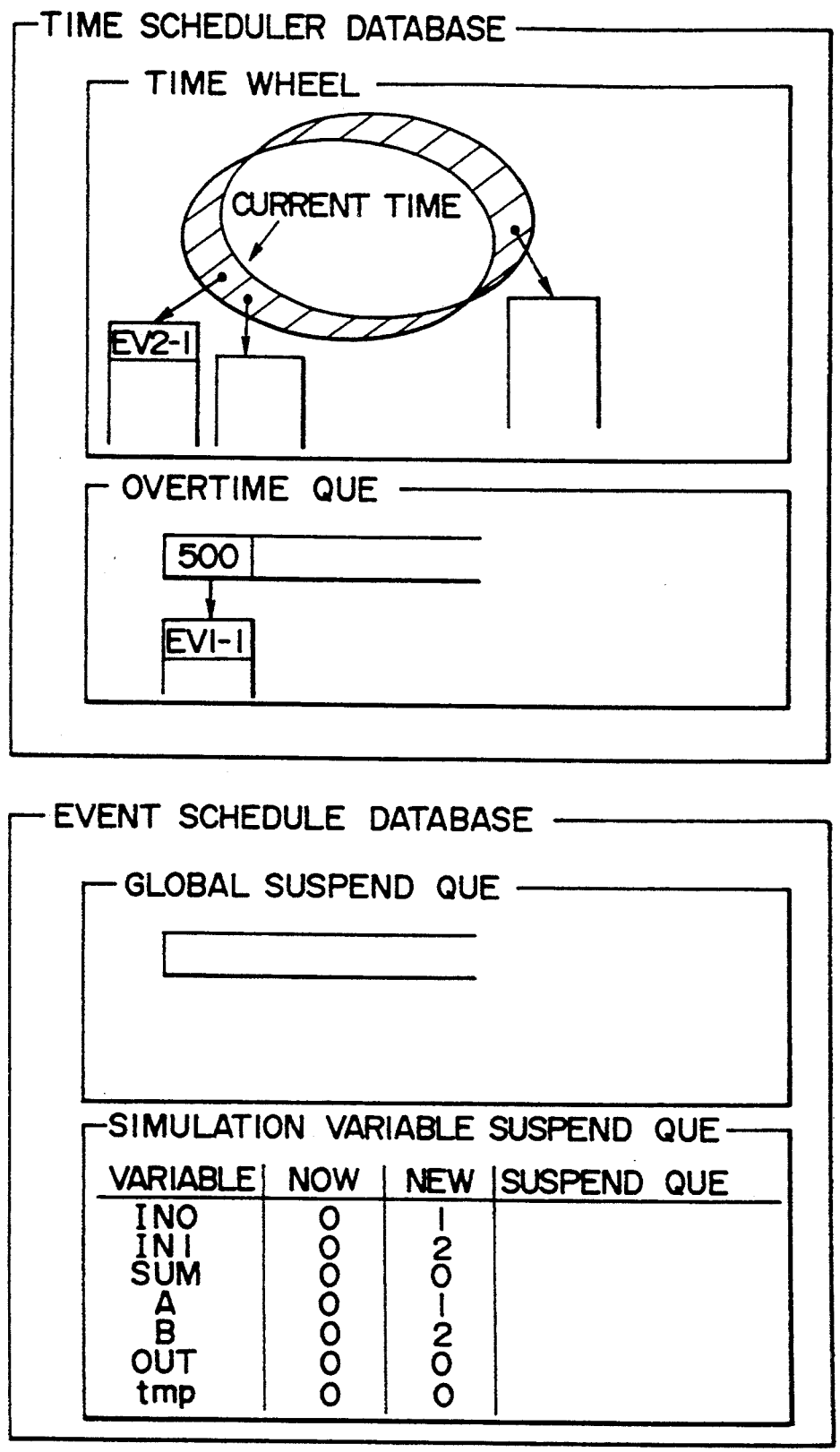
Figure 15E:
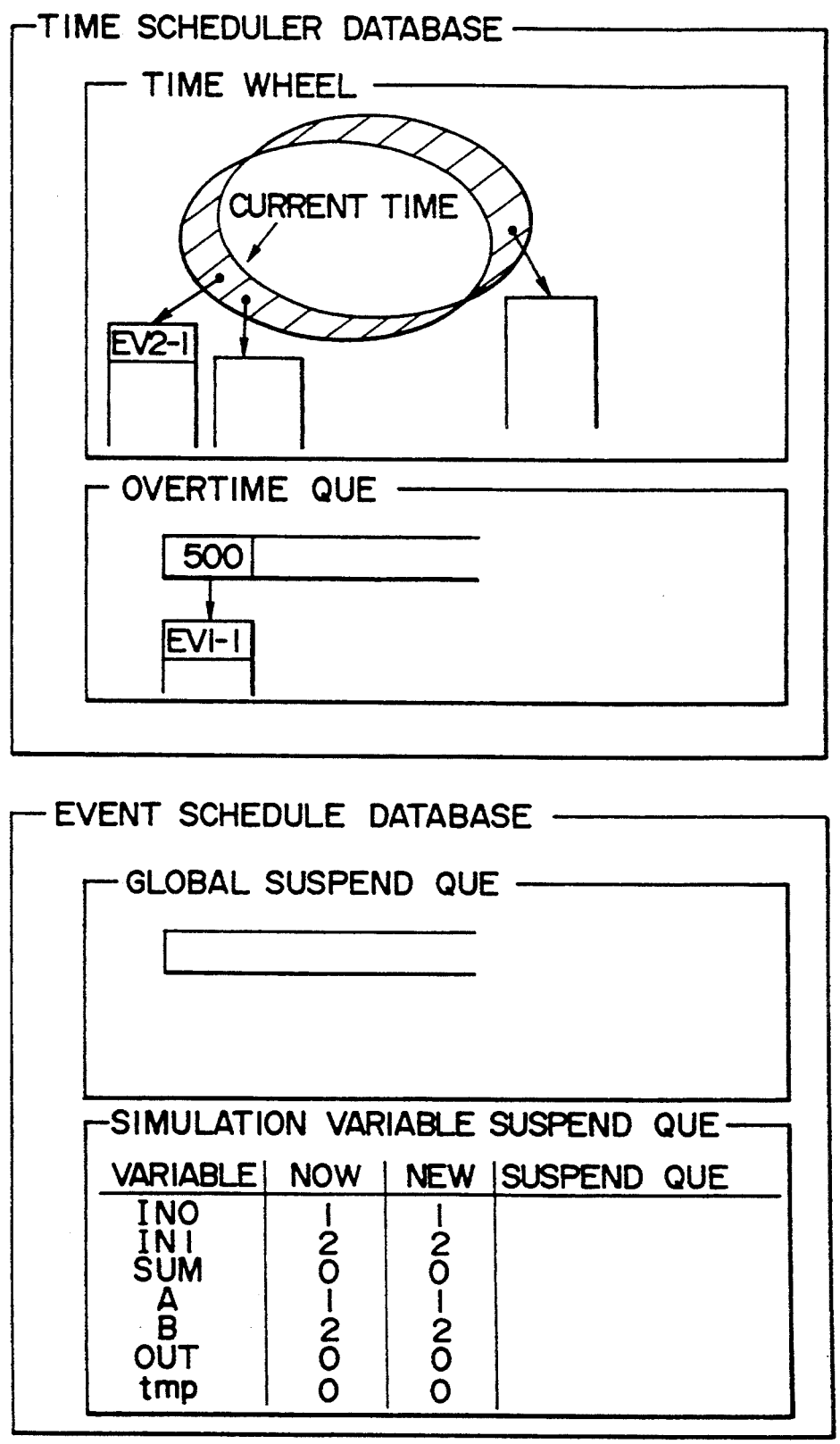
Figure 15G:
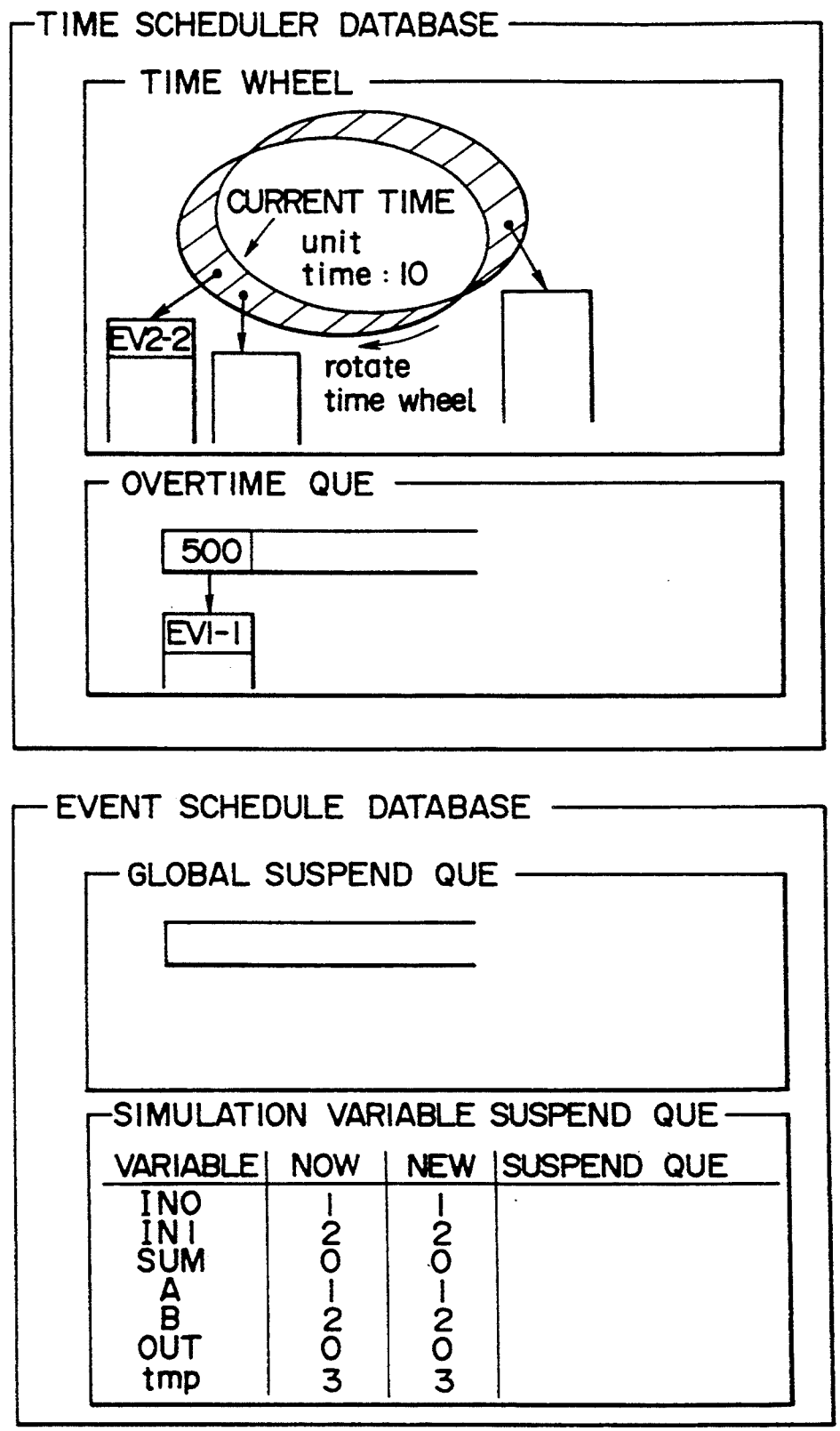
Figure 15H:
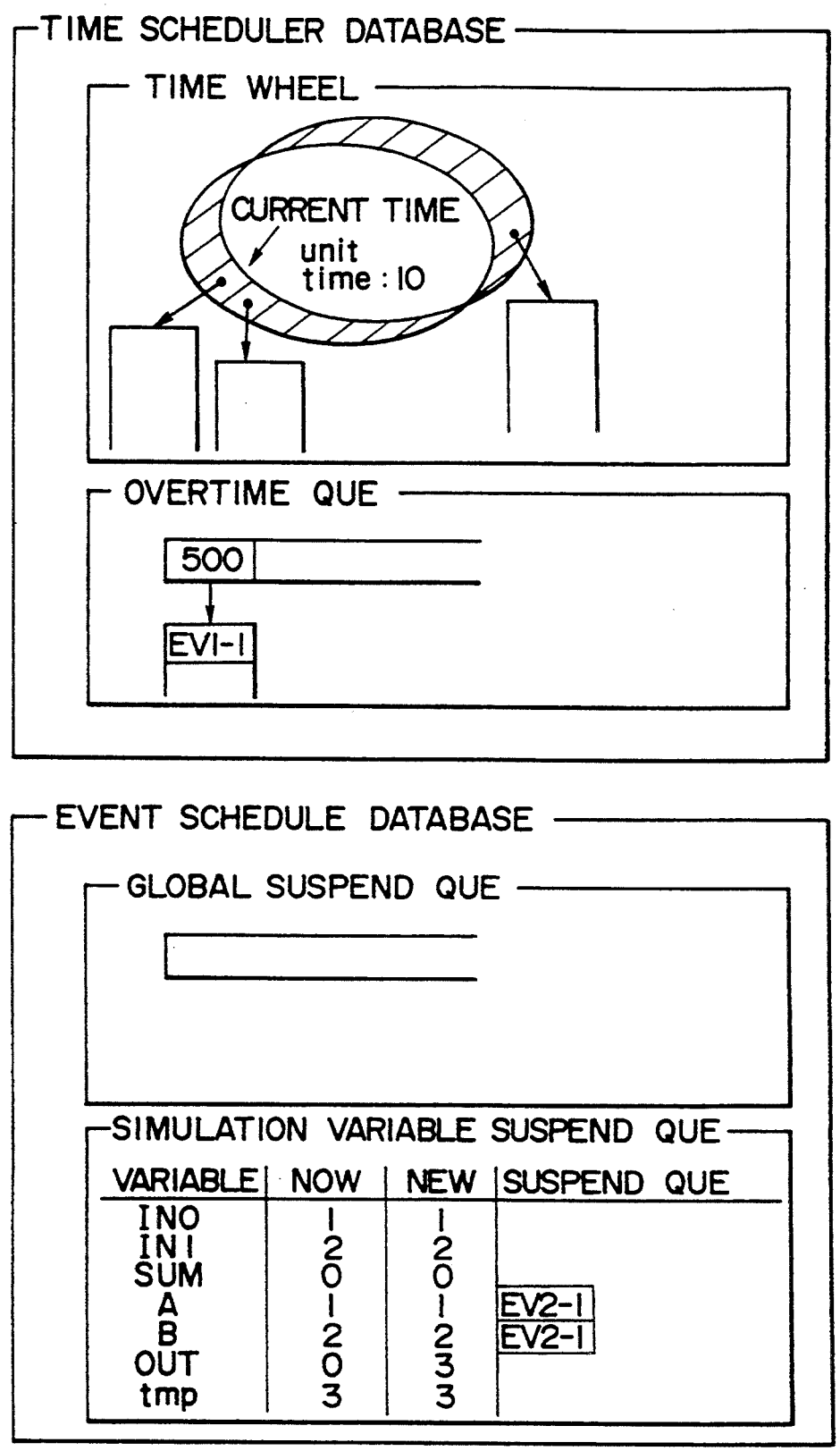

The node cell is similar in concept to the cell in the Lisp programming language. Each node cell includes five data storing regions, i.e., (1) Type, (2) car, (3) cbr, (4) ccr and (5) cdr regions. The data stored in the car, cbr, ccr and cdr regions are defined by the Type. In the car, cbr, ccr and cdr regions of each node cell are stored (1) node-cell, (2) a series of letters (letters embraced by ″″″″), (3) numerical value, and (4) pointer to another database. In the present specification and the drawings, it is to be noted that, for the sake of clarity, each node-cell is described with the format of '(' <type> <car region> <cbr region> <ccr region> <ced region> ')'. The delimit of each data is represented by space, tab and carriage return. And, "null" indicates the absence of description data and "nil" indicates non-use. FIG. 10 illustrates a part of the data structure shown in FIG. 9 in the form of tree structure.

The database or data structure shown in FIG. 9 maintains the manner of description according to the HDL syntax so that the data is not suited for processing by a computer. Therefore, the data will be processed to redefine a database suitable for computer processing. For this purpose, the data shown in FIG. 9 is subjected to an element decomposition processing. Described more in detail in this respect, in declaring parameter "reg" in the HDL language, it may be described as reg [7:0] A, B, C;
or, alternatively, it may also be described as
reg [7:0] A;
reg [7:0] B;
reg [7:0] C;
and, the latter data format is more suitable for computer processing. Thus, in order to modify all of the descriptions in the above-mentioned latter format, the data in FIG. 9 is subjected to the element decomposition processing. The resulting database is shown in FIG. 11. It is to be noted that, during this element decomposition processing, a step of extraction of variables 11 in FIG. 4 is also carried out, i.e., extraction of global and local variables inside modules, so that the newly defined database according to this process also includes the information of the list of variables 11a in FIG. 4. It is to be noted also that the description in the resulting database in FIG. 11 is made according to a list representation method used in the Lisp programming language and not according to the beforementioned representation method of the node-cell.

Then, the database shown in FIG. 11 is subjected to discrimination step 103 in FIGS. 3 and 13 in FIG. 4, so that each of the statements in the database in FIG. 11 is classified between (1) a sequential process, which does not depend on the scheduler 106a or 19a and (2) a parallel process, which depends on the scheduler 106a or 19a. If a plurality of sequential statements follow one after another, these sequential statements are collected as a group. As a result, the processing within "initial" and "always" variables becomes either one of (1) sequential process, (2) delay control and (3) event control. FIG. 12 shows how the data produced as a result of the element decomposition processing and indicated as "SAMPLE INPUT" can be converted into the classified or discriminated data indicated as "SAMPLE RESULT." Please note that, in FIG. 12, each list having a format of (Sequential . . . ) corresponds to the sequential process 13a in FIG. 4 and a list having a format of (# . . . ) or (@ . . . ) corresponds to the parallel process 13b in FIG. 4. In addition, during this process, the optimization step 12 is also carried out. Described more in detail, the <statement> in each of "initial" and "always" blocks is analyzed to make a list of variables used therein. Then, in a list of variables of the module as a whole, the variables used in each of "initial" and "always" blocks are checked, whereby the non-used variables are omitted from the database. Besides, in the "initial" and "always" blocks, a list of variables used in these blocks is made. At the same time, the local variables declared in the respective blocks are converted into the variables at the module level, thereby replacing the local variables used by reference and substitution within a block with the module level variables. The resulting data corresponds to the optimized list of variables 12b in FIG. 4. The result of classification or discrimination of the data shown in FIG. 11 according to the above-described discrimination or classification scheme is shown in FIG. 13.

The data shown in FIG. 13 has a statement including "@" and "#" so that these parallel or event trigger variables must be converted into corresponding predetermined sequential variables. For this purpose, the data shown in FIG. 13 is subjected to the conversion step 104 in FIG. 3 or 15 in FIG. 4. That is, in this parallel-sequential conversion process, the <statement> corresponding to Delay_Control and Event_Control of HDL is developed into a sequential process variable for controlling the scheduler. What is important in this conversion stop is the conversion of (1) delay control and (2) event control which have been extracted during the discrimination step. These data are converted into sequential variables having (1) a setting process and (2) a scheduler call process.

Regarding the conversion of the delay control, (#<statement>) is converted into (setDelay <statement>)(callScheduler WaitDelay). On the other hand, regarding the conversion of the event control, (@(<variable1> <variable2> . . . <variablen>)) is converted into a sequence of plural sequential steps, including (setWaitEvent<variable1>)
(setWaitEvent<variable2>)
......
(setWaitEvent<variablen>)
(callScheduler WaitEvent)

It is to be noted that the data corresponding to (setDelay . . . ), (setWaitEvent . . . ) constitute the sequential data 14a in FIG. 4 and the data corresponding to (callScheduler WaitDelay), (callScheduler WaitEvent) constitute the sequential data 15a in FIG. 4.

Finally, each item of the information obtained as a result of the above-described conversion process is then converted into a corresponding description of the selected programming language (or C language in the present embodiment). This process corresponds to the conversion step 16 in FIG. 4. The resulting C language source file corresponds to the program language description information 16a in FIG. 4. Regarding the structure of the C language version thus produced, one module is developed into at least one function. The "initial" and "always" blocks are developed as respective single functions. The thus produced C language source file has the following structure.

(a) module initialization function
    (a1) declaration of in-module variables
    (a2) call of instance module initialization functions
    (a3) call of "initial" and "always" block functions
(b) initial/always functions
    (b1) call of in-module functions
    (b2) process of <statement> in initial/always blocks The original HDL file of the above-described example is illustrated in Appendix I, which can be found in the application file, attached to this specification and the C language source file converted from the HDL file according to the above-described process is illustrated in Appendix II, which can be found in the application file, also attached to this specification.

Finally, it will now be described as to how an actual simulation operation is carried out under the control of the scheduler 106a or 19a using the converted C source file simulation program.

When the HDL file having a module for ADDER and another module for ADD_test1 shown in FIG. 8 has been converted into a corresponding C source file according to the present conversion scheme as described above, there are obtained the following five C language functions.

1) ADD_test1 ( )

This is an initialization function of ADD_test1 module and has the following functions.

1—1) Securing and initializing a storing region for variable IN0
1-2) Securing and initializing a storing region for variable IN1
1-3) Securing and initializing a storing region for variable SUM
1-4) Securing and initializing a storing region for internal use
1-5) Calling of function ADDER( )—formation of an instance
1-6) Securing and initializing a storing region for Event-0(ADD_test1_initial0( )), and registering it at a current time position of time wheel
1-7) Securing and initializing a storing region for Event-1(ADD_test1_initial1( )), and registering it at a current time position of time wheel

2) ADD_test1_initial0( )

This is a development of the first "initial" block statement of ADD_test1 module. Since this function only deals with a process for displaying the result of execution, no details will be shown here.

3) ADD_test1 initial1( )

This is a development of the second "initial" block statement of ADD_test1 module.

```
entry 0:
    IN0 ← 1 ; IN1 ← 2 ;
    #500
entry 1:
    IN0 ← 10 ; IN1 ← 20 ;
    #100
entry 2:
    ............
    ............
    ............
```

4) ADDER( )

This is an initialization function of ADDER module and it has the following functions.
4-1) Securing and initializing a storing region for variable A, and netlist connection
4-2) Securing and initializing a storing region for variable B, and netlist connection
4-3) Securing and initializing a storing region for variable OUT, and netlist connection
4-4) Securing and initializing a storing region for variable tmp
4-5) Securing and initializing a storing region for internal use
4-6) Securing and initializing a storing region for Event-2(ADDER_always( )), and registering it at a current time position of time wheel

5) ADDER_always( )

This is a development of the first "always" block statement of ADDER module.
entry 0:
Detect a change in A, B.
entry 1:
  tmp ← A+B;
  #10
entry 2:
  OUT ← tmp;
  GOTO entry 0

As shown in FIG. 8, since module "ADD_test1" has two initial blocks, each starting with "initial begin" and ending with "end", there have been developed two C language functions, i.e., ADD_test1_initial0( ) and ADD_test1_initial1( ), as described above. On the other hand, module "ADDER (OUT, A, B)" has only one "always" block, starting with "always" and ending with "end", there has been developed only one C language function which is ADDER_always0( ).

Examining the above-described five C language functions, it is noted that the ADDER( ) function is nested in the ADD_test1( ) function so that ADDER( ) function is defined as an instance of ADD_test1( ) function. More importantly, it is noted that only two functions, i.e., ADD_test1_initial1( ) and ADDER_always0( ), are controlled by the scheduler 106a or 19a when a simulation operation is carried out. As described before, since each of these two functions has an entry number for each of the elements of the function, the operation of the function may be started from a desired entry point by designating the desired entry point through an argument when calling the function.

Now, the procedure of a simulation operation using these C language functions will be described with reference to FIGS. 15-A through 15-I in detail.

FIG. 15-A illustrates an initialization step of the scheduler 106a or 19a upon completion of the initialization of the simulator, and, in this condition, registration of simulation variables and events is carried out. As shown in FIG. 15-A, as a result of the initialization, there have been registered two events, i.e., EV1-0 and EV2-0, in the time wheel at the current time location which has unit time 0 in terms of simulation time. In the present embodiment, it is assumed that the time wheel can register events up to 16 time units and no more since there are 16 time slots. The events occurring beyond time unit 16 are registered in the overtime que. The events EV1-0 and EV2-0 include the following information.

| EV1-0 | EVENT-1 |
| | entry 0 |
| | Name of Function: ADD_test1_initial1( ) |
| ENV-2 | EVENT-2 |
| | entry 0 |
| | Name of Function; ADDER_always0( ) |

Since the current time is unit time 0, all of the variables listed in the simulation variable suspend que have "0" as the current values indicated by "NOW" and as the new values indicated by "NEW."

FIG. 15-B illustrates the condition upon completion of execution of EVENT-1. The current time is still at unit time 0, though it is not specifically shown. The scheduler 106a or 19a first removes EV1-0 from the current time location of time wheel and executes EV1-0. When EV1-0, i.e., EVENT-1 and entry 0, is executed, "1" is assigned to IN0 and "2" is assigned to IN1 as shown in the simulation variable suspend que while temporarily storing the information of #500. Then, the entry number of EVENT-1 is incremented by 1. Since the statement of "#500" indicates to wait for unit time 500, this should be registered in the overtime que. As a result, a time region having 500 unit time is created in the overtime que and EV1-1, i.e., EVENT1 and entry 1, is registered in that region as shown in FIG. 15-B.

FIG. 15-C illustrates the condition upon execution of EV2-0, i.e., EVENT-2 and entry 0, following the completion of execution of EV1-0 as described above. That is, the scheduler first removes EV2-0 from the current time location of time wheel and then the entry number of EVENT-2 is incremented by 1. The execution of EVENT-2 depends on the occurrence of a specific event. That is, since EVENT-2 has a function of "@(A or B)", EVENT-2 is executed when there has been a change in either of A or B. Thus, EVENT-2 is registered in the suspend que section of simulation variables A and B as EV2-1, i.e., EVENT-2 and entry 1.

Then, as shown in FIG. 15-D, the scheduler carries out transfer of the netlist data, i.e., the data of variables IN0 and IN1 in module ADD_test1_initial1( ) being transferred to the corresponding variables A and B, respectively, in module ADDER_always0( ), which is defined as an instance of ADD_test1( ). As a result, values of "1" and "2" are assigned as new values of variables A and B, respectively, as shown in the simulation variable suspend que of FIG. 15-D. Then, it is checked whether or not there has been any change in the values of the simulation variables which are registered in the suspend que to wait for the occurrence of an event. For this purpose, a comparison is made between the NOW and NEW values for such variables, or A and B in the present example. Since the NEW values of A and B have been changed to "1" and "2", respectively, as described above, the current event of EV2-1 is removed from the suspend que and reregistered in the time wheel at its current time location so as to have it executed now.

Since the checking of the presence of changes in the simulation variables of the stand-by events registered in the suspend que has been carried out as described above, the NEW values are copied to the NOW values under the control of the scheduler as shown in FIG. 15-E.

Since event EV2-1 is present at the current time location of time wheel, event EV2-1 is executed. The resulting condition is illustrated in FIG. 15-F. That is, at entry 1 of EVENT-2 (or EV2-1), the following process is implemented.

tmp ← A+B
10

Described more in detail, the scheduler first removes EV2-1 from the time wheel and then executes EV2-1 (or entry 1 of EVENT-2). That is, a sum of A and B, i.e., the value of 3 since A and B are 1 and 2, respectively, is stored into variable tmp as shown in the simulation variable suspend que in FIG. 15-F and the information of waiting for 10 unit time is temporarily stored. Then, the entry number of EVENT-2 is incremented by 1 so that EV2-2 is produced. Then, this event EV2-2 is registered in the time wheel at a location 10 unit time later.

Then, the NEW values are copied into the corresponding NOW values in the simulation variables. Then, since there is no event up to unit time 10, the time wheel is forced to rotate or the simulation time is advanced until the time slot, which includes EV2-2, has reached the current time location as shown in FIG. 15-G.

Since event EV2-2 is now present in the current time location of time wheel, event EV2-2 is executed. That is, the scheduler first removes EV2-2 from the time wheel and the process of OUT ← tmp is carried out so that the value of 3 is assigned to the NEW value of OUT in the simulation variable suspend que. Thereafter, the entry number of EVENT-2 is changed to 1 since the "always" statement is a repetitive statement. Then, the EVENT-2 entry 1, i.e., EV2-1, is again registered in the suspend que section of simulation variables A and B as shown in FIG. 15-H.

Then, the scheduler carries out the transfer of netlist data, i.e., the data being transferred to an upper hierarchical module. More specifically, the value of variable OUT is transferred to variable SUM. Thereafter, the NEW values are copied into the NOW values in the simulation variables. Under the condition, since there is no more event to be executed in the time wheel, the event in the overtime que is transferred to the time wheel at an appropriate time slot. Then, the simulation time is caused to advance until the time slot of time when storing EV1-1 has reached the current time location as shown in FIG. 15-I.

Then, it is set ready to execute event EV1-1. In this manner, all of the events in function ADD_test1_initial1( ) are executed one after another under the control of the scheduler 106a, 19a in a proper time sequence. Therefore, the scheduler 106a, 19a plays an important role in executing a simulation according to the converted C language file of the present invention.

While the above provides a full and complete disclosure of the preferred embodiments of the present invention, various modifications, alternate constructions and equivalents amy be employed without departing from the true spirit and scope of the invention. For example, at least a part of the functions described above may be implemented in the form of software routines or in the form of hardware. Therefore, the above description and illustration should not be construed as limiting the scope of the invention, which is defined by the appended claims.

What is claimed is:

1. A method for automatically converting with a data processing apparatus a simulation program written by a function description language into an executable program written by a selected programming language, comprising the steps of:

creating a simulation program written by a function description language and including sequential and parallel process variables;

discriminating the parallel process variables from the sequential process variables in said simulation program;

converting the parallel process variables into corresponding sequential process variables, thereby converting said simulation program into an intermediate program free of the parallel process variables; and converting said intermediate program into an executable program written by the selected programming language and using a predetermined scheduler which controls a sequence of occurrence of events as a function of simulation time.

2. The method of claim 1, wherein said step of creating a simulation program written by a function description language includes creation of an HDL file by the Verilog-HDL and the parallel process variables are those variables including a symbol "@" or "#" and the sequential process variables are those variables having no such symbols.

3. The method of claim 2, wherein said discriminating step includes a second discriminating step for checking whether or not each of symbols "@" and "#" which have been found takes an expression which is sequential in nature.

4. The method of claim 1, wherein said intermediate program is a C language source file.

5. The method of claim 1, wherein said scheduler includes a time schedule database for registering events to be executed as a function of simulation time and an event schedule database for registering events to be executed when a predetermined condition has occurred irrespective of simulation time.

6. A system for automatically converting with a data processing apparatus a simulation program written by a function description language into an executable program written by a selected programming language, comprising:

storing means for storing a simulation program written by a function description language and including sequential and parallel process variables;

discriminating means for discriminating the parallel process variables from the sequential process variables in said simulation program;

converting means for converting the parallel process variables into corresponding sequential process variables in accordance with a predetermined manner, thereby defining an intermediate program free of said parallel process variables; and converting means for converting said intermediate program into an executable program written by the selected programming language and using a predetermined scheduler which controls a sequence of occurrence of events as a function of simulation time.

7. The system of claim 6, wherein said function description language is the Verilog-HDL and the parallel process variables are those variables including a symbol "@" or "#" and the sequential process variables are those variables having no such symbols.

8. The system of claim 7, wherein said discriminating means includes another discriminating means for checking whether or not each of symbols "@" and "#" which have been found takes an expression which is sequential in nature.

9. The system of claim 6, wherein said intermediate program is a C language source file.

10. The system of claim 6, wherein said scheduler includes a time schedule database for registering events to be executed as a function of simulation time and an event schedule database for registering events to be executed when a predetermined condition has occurred irrespective of simulation time.

* * * * *